(12) United States Patent
Sasagawa

(10) Patent No.: US 7,709,368 B2
(45) Date of Patent: May 4, 2010

(54) SEMICONDUCTOR DEVICE AND METHOD FOR MANUFACTURING THE SAME

(75) Inventor: Shinya Sasagawa, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 20 days.

(21) Appl. No.: 12/046,881

(22) Filed: Mar. 12, 2008

(65) Prior Publication Data

US 2008/0237876 A1 Oct. 2, 2008

(30) Foreign Application Priority Data

Mar. 26, 2007 (JP) .............................. 2007-079609

(51) Int. Cl.
 *H01L 21/4763* (2006.01)
(52) U.S. Cl. ...................... 438/618; 438/622; 438/648; 438/656; 438/700
(58) Field of Classification Search .................. 438/98, 438/100, 584–688; 257/210–211, 503, 508, 257/E33.062–E33.066, E31.124–E31.126, 257/E51.019
See application file for complete search history.

(56) References Cited

U.S. PATENT DOCUMENTS

| | | | |
|---|---|---|---|
| 5,121,186 A | 6/1992 | Wong et al. | |
| 5,338,702 A | 8/1994 | Kobeda et al. | |
| 5,341,028 A | 8/1994 | Yamaguchi et al. | |
| 5,583,366 A | 12/1996 | Nakazawa | |
| 5,656,825 A | 8/1997 | Kusumoto et al. | |
| 5,940,690 A | 8/1999 | Kusumoto et al. | |
| 5,940,732 A | 8/1999 | Zhang | |
| 6,001,683 A | 12/1999 | Lee | |
| 6,043,164 A * | 3/2000 | Nguyen et al. | 438/736 |
| 6,187,663 B1 | 2/2001 | Yu et al. | |
| 6,235,628 B1 | 5/2001 | Wang et al. | |
| 6,284,591 B1 | 9/2001 | Lee | |
| 6,294,799 B1 | 9/2001 | Yamazaki et al. | |
| 6,337,232 B1 | 1/2002 | Kusumoto et al. | |
| 6,388,291 B1 | 5/2002 | Zhang et al. | |
| 6,433,361 B1 | 8/2002 | Zhang et al. | |
| 6,455,875 B2 | 9/2002 | Takemura et al. | |
| 6,521,533 B1 | 2/2003 | Morand et al. | |
| 6,541,795 B2 | 4/2003 | Kusumoto et al. | |
| 6,707,107 B2 | 3/2004 | Kido | |
| 6,740,599 B2 | 5/2004 | Yamazaki et al. | |
| 6,841,315 B2 | 1/2005 | Imura | |

(Continued)

FOREIGN PATENT DOCUMENTS

JP 02-076264 3/1990

(Continued)

*Primary Examiner*—Fernando L Toledo
*Assistant Examiner*—Mamadou Diallo
(74) *Attorney, Agent, or Firm*—Nixon Peabody LLP; Jeffrey L. Costellia

(57) ABSTRACT

A method for easily manufacturing a semiconductor device in which variation in thickness or disconnection of a source electrode or a drain electrode is prevented is proposed A semiconductor device includes a semiconductor layer formed over an insulating substrate; a first insulating layer formed over the semiconductor layer; a gate electrode formed over the first insulating layer; a second insulating layer formed over the gate electrode; an opening which reaches the semiconductor layer and is formed at least in the first insulating layer and the second insulating layer; and a step portion formed at a side surface of the second insulating layer in the opening.

6 Claims, 17 Drawing Sheets

U.S. PATENT DOCUMENTS

| | | |
|---|---|---|
| 6,882,018 B2 | 4/2005 | Ohtani et al. |
| 6,911,688 B2 | 6/2005 | Yamazaki et al. |
| 6,972,263 B2 | 12/2005 | Yamazaki et al. |
| 6,992,332 B2 | 1/2006 | Yamazaki et al. |
| 7,038,239 B2 | 5/2006 | Murakami et al. |
| 7,125,654 B2 | 10/2006 | Hirota |
| 7,223,666 B2 | 5/2007 | Ohtani et al. |
| 7,238,557 B2 | 7/2007 | Hayakawa |
| 7,242,021 B2 | 7/2007 | Yamazaki et al. |
| 7,297,629 B2 | 11/2007 | Wang |
| 2001/0033001 A1 | 10/2001 | Kato |
| 2003/0189210 A1 | 10/2003 | Yamazaki et al. |
| 2003/0193054 A1 | 10/2003 | Hayakawa et al. |
| 2005/0118827 A1* | 6/2005 | Sato et al. .................... 438/700 |
| 2006/0060861 A1 | 3/2006 | Yamazaki et al. |
| 2006/0255465 A1 | 11/2006 | Kishiro |
| 2007/0210451 A1 | 9/2007 | Ohtani et al. |
| 2007/0228374 A1 | 10/2007 | Hayakawa |
| 2008/0237875 A1 | 10/2008 | Yamazaki et al. |

FOREIGN PATENT DOCUMENTS

| | | |
|---|---|---|
| JP | 05-013762 | 1/1993 |
| JP | 07-335906 | 12/1995 |
| JP | 08-018055 | 1/1996 |
| JP | 09-135005 | 5/1997 |
| JP | 2003-218362 | 7/2003 |

* cited by examiner

SEMICONDUCTOR DEVICE AND METHOD FOR MANUFACTURING THE SAME

BACKGROUND OF THE INVENTION

1. Field of the Invention

The present invention relates to a semiconductor device and a manufacturing method thereof. In this specification, the semiconductor device refers to any device which can function with the use of semiconductor characteristics.

2. Description of the Related Art

In recent years, there has been extensive production of semiconductor devices in which a thin film transistor (a TFT) is formed over a substrate such as a glass substrate which has an insulating surface and used as a switching element or the like. In the thin film transistor, an island-shaped semiconductor layer is formed over a substrate having an insulating surface by a CVD method, a photolithography process, or the like, and part of the island-shaped semiconductor layer is used as a channel formation region of the transistor (for example, see Reference 1: Japanese Published Patent Application No. H08-018055).

An example of a schematic cross-sectional view of a thin film transistor is shown in FIG. 17. As shown in FIG. 17, in the thin film transistor, an insulating layer 31 which serves as a base film is formed over a substrate 30; a semiconductor layer 32 which includes a channel formation region 32a and impurity regions 32b and 32c each of which serves as a source region or a drain region is formed over the insulating layer 31; an insulating layer 33 which serves as a gate insulating layer is formed over the semiconductor layer 32 and the insulating layer 31; a conductive layer 34 which serves as a gate electrode is formed over the insulating layer 33; an insulating layer 203 is formed over the conductive layer 34; and wirings 204 which are electrically connected to the impurity regions 32b and 32c through openings which are formed in the insulating layer 203 and the insulating layer 33 are formed. Note that in FIG. 17 and other drawings in this specification, the semiconductor layer is illustrated to be thicker than in other structures to describe the cross-sectional structure; however, the actual thickness is the value mentioned in this specification.

In the thin film transistor shown in FIG. 17, when the contact hole is formed on the thin semiconductor layer, it has been necessary to form the opening so as not to etch the surface of the source region or the drain region. Therefore, it has been difficult to control the etching.

In addition, in the thin film transistor shown in FIG. 17, the material of the wiring 204 does not adequately cover the side surface of the contact hole which is formed in the insulating layer 203. In some cases, the wiring 204 is not formed particularly around the corner formed by the surface of the semiconductor layer 32 and the insulating layer 33 (around a region 2001); thus, there have been problems in that the wiring 204 is partially thinned or disconnected, and reliability of the element is lowered.

Therefore, a method for forming a contact hole into a tapered shape is proposed so that the material of the wiring 204 can adequately cover the side surface of the contact hole. However, in this method, there are problems in that the upper portion of the contact hole is widened when the contact hole is formed into a tapered shape, and a minute contact hole is difficult to be formed.

Thus, as a method for more easily filling a minute contact hole with a wiring material, a method for forming a contact hole having a step portion in an insulating layer formed over a gate electrode and filling the contact hole with a wiring material is proposed (e.g., reference 2: Japanese Published Patent Application No. H09-135005).

SUMMARY OF THE INVENTION

However, in Reference 2, the contact hole having the step portion at the side surface of the insulating layer is formed by etching the insulating layer by two etching processes; thus, there have been problems in that the number of masks and manufacturing steps are increased, the process becomes complicated, and the manufacturing cost is increased.

In addition, even when the method for forming a wiring described in Reference 2 is used, the problems of the conventional thin film transistors are kept unsolved. That is, even when the method for forming a wiring disclosed in Reference 2 is used, since the wiring is electrically connected to the surface of the source region or the drain region, it has been necessary to form the semiconductor layer which serves as the source region or the drain region at the bottom of the opening. Therefore, it has been difficult to control etching in formation of the opening in the insulating layer. This is particularly serious when the semiconductor layer is formed of a thin film with a thickness of 50 nm or less.

The present invention is a technique which can solve such problems and proposes a method for easily manufacturing a semiconductor device in which variation in thickness or disconnection of a source electrode or a drain electrode is prevented. Further, the present invention proposes a semiconductor device in which etching in formation of a contact hole can be easily controlled and a manufacturing method thereof.

The semiconductor device of the present invention has a feature that a contact hole having a step portion at the side surface is formed using a resist having a step portion at the side surface as a mask, and a conductive layer is formed in the contact hole.

A semiconductor device of the present invention includes a semiconductor layer formed over an insulating substrate; a first insulating layer formed over the semiconductor layer; a gate electrode formed over the first insulating layer; a second insulating layer formed over the gate electrode; a conductive layer which is formed over the second insulating layer, is in contact with the semiconductor layer, and covers the side surface of an opening which reaches the semiconductor layer and is formed at least in the first insulating layer and the second insulating layer; and a step portion formed at the side surface of the second insulating layer in the opening. The opening formed in the first insulating layer is smaller than that formed in the second insulating layer.

A semiconductor device of the present invention includes a first insulating layer formed over an insulating substrate; a second insulating layer formed over the first insulating layer; a semiconductor layer formed over the second insulating layer; a third insulating layer formed over the semiconductor layer; a gate electrode formed over the third insulating layer; a fourth insulating layer formed over the gate electrode; and a conductive layer which is formed over the fourth insulating layer, is in contact with the first insulating layer, and covers the side surface of an opening which reaches the first insulating layer and is formed at least in the second insulating layer, the semiconductor layer, and the fourth insulating layer. In the semiconductor device, the opening formed in the semiconductor layer is smaller than that formed in the fourth insulating layer. The opening is formed by etching at least the second insulating layer, the semiconductor layer, and the fourth insulating layer using a resist which has a step portion at the side surface and is formed over the fourth insulating layer as selected as a mask.

A semiconductor device of the present invention can be manufactured by forming a semiconductor layer over an insulating substrate; forming a first insulating layer over the semiconductor layer; forming a gate electrode over the first insulating layer; forming a second insulating layer over the gate electrode; forming a resist having a step portion at the side surface over the second insulating layer; forming an opening which reaches the semiconductor layer at least in the second insulating layer and forming a step portion at the side surface of the second insulating layer by etching using the resist as a mask; and forming a conductive layer so as to be in contact with the semiconductor layer at the side surface of the opening and over the second insulating layer. Note that the opening can be formed by dry etching.

A semiconductor device of the present invention can he manufactured by forming a first insulating layer over an insulating substrate; forming a second insulating layer over the first insulating layer; forming a semiconductor layer over the second insulating layer; forming a third insulating layer over the semiconductor layer; forming a gate electrode over the third insulating layer; forming a fourth insulating layer over the gate electrode; forming a resist having a step portion at the side surface over the fourth insulating layer; forming an opening which reaches the first insulating layer at least in the second insulating layer, the semiconductor layer, and the fourth insulating layer by etching using the resist as a mask such that the opening formed in the semiconductor layer is smaller than that formed in the fourth insulating layer; and forming a conductive layer so as to be in contact with the first insulating layer at the side surface of the opening and over the fourth insulating layer. Note that the opening can be formed by dry etching.

In the semiconductor device of the present invention, an insulating sidewall may be provided at a side surface of the semiconductor layer In the present invention, since a contact hole having a step portion at the side surface can be formed by one etching process, the number of masks and manufacturing steps can be reduced. Therefore, a semiconductor device with favorable characteristics in which variation in thickness or disconnection of a source electrode or a drain electrode formed in the contact hole is prevented can be easily manufactured.

Further, in the present invention, when the source electrode or the drain electrode is made in contact with a source region or a drain region at the side surface of the contact hole which is formed in the source region or the drain region, since it is not necessary to stop etching at the surface of a semiconductor layer, the etching in formation of the contact hole can be easily controlled. Thus, a semiconductor device in which deterioration of characteristics is suppressed can be easily manufactured.

DETAILED DESCRIPTION OF THE INVENTION

Figure 1A:
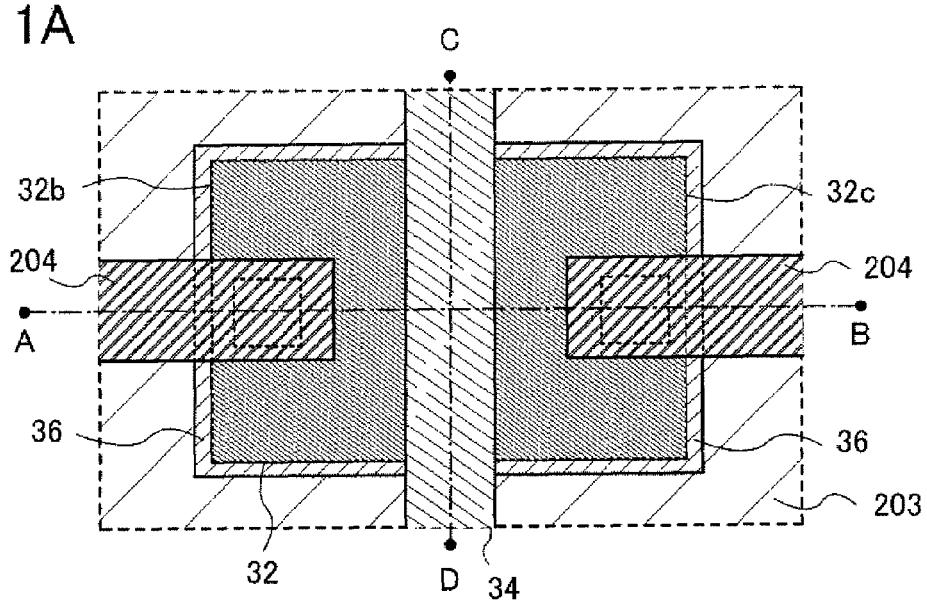
FIG. 1A is a top view and FIGS. 1B and 1C are cross-sectional views for explaining a structure of a semiconductor device of the present invention.

Hereinafter, embodiment modes of the present invention will be described with reference to the accompanying drawings. Note that the present invention is not limited to the following description, and it is easily understood by those skilled in the art that modes and details thereof can be modified in various ways without departing from the spirit and the scope of the present invention. Therefore, the present invention should not be interpreted as being limited to the following description of the embodiment modes. In a structure of the present invention to be given below, the same portions or portions having similar functions may be denoted by the same reference numerals in different drawings.

Embodiment Mode 1

Figure 1B:
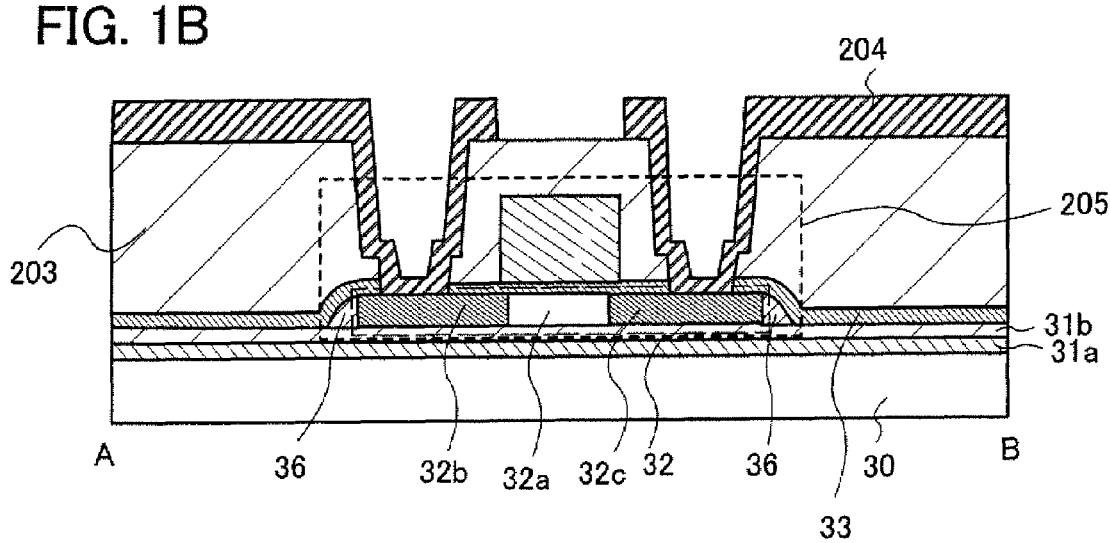
Figure 1C:
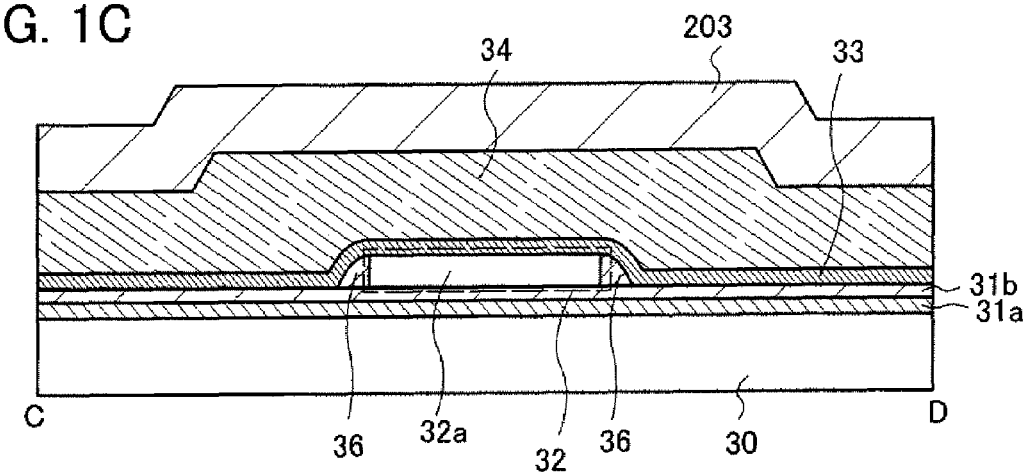

In this embodiment mode, a structure of a semiconductor device in which variation in thickness or disconnection of a source electrode or a drain electrode is prevented and a method for manufacturing the semiconductor device will be described, FIG. 1A is a top view and FIGS. 1B and 1C are cross-sectional views for explaining a main structure of a semiconductor device of the present invention. FIG. 1A is a top view which shows a thin film transistor. FIG. 1B shows a cross section taken along a broken line joining A and B in FIG. 1A. FIG. 1C shows a cross section taken along a broken line joining C and D in FIG. 1A.

A semiconductor device described in this embodiment mode includes a thin film transistor 205 having an island-shaped semiconductor layer 32 which is provided over a substrate 30 with an insulating layer 31 interposed therebetween, a gate insulating layer 33 formed over the semiconductor layer 32, and a conductive layer 34 which serves as a gate electrode and is provided over the semiconductor layer 32 with the gate insulating layer 33 interposed therebetween; an insulating layer 203 which is provided to cover the gate insulating layer 33 and the conductive layer 34; and conductive layers 204 each of which serves as a source electrode or a drain electrode and is provided over the insulating layer 203 (FIGS. 1A to 1C). The semiconductor layer 32 includes a channel formation region 32a and impurity regions 32b and 32c each of which serves as a source region or a drain region. An insulating layer 36 is formed at an end portion of the semiconductor layer 32 which here is a section that is in contact with the channel formation region 32a below the conductive layer 34.

In the semiconductor device described in this embodiment mode, the insulating layer 203 and the gate insulating layer 33 are etched to form contact holes (also referred to as openings) which reach the semiconductor layer 32, and then, the conductive layers 204 are formed over the insulating layer 203 and in the contact holes. A step portion is formed at the side surface of the insulating layer 203. By providing the step portion, the conductive layer 204 can adequately cover the side surface of the contact hole.

In the semiconductor device described in this embodiment mode, since the contact hole is formed using a resist which has a step portion at the side surface as a mask, a contact hole having a step portion at the side surface of the insulating layer 203 can be formed by one etching process. Since the step portion is formed at the side surface of the contact hole formed in the insulating layer 203, the conductive layer 204 can adequately cover the side surface of the insulating layer 203. Accordingly, variation in thickness or disconnection of the conductive layer 204 can be prevented, and variation in contact resistance can be suppressed. Therefore, a semiconductor device with favorable characteristics can be easily manufactured without increasing the number of masks and manufacturing steps.

The insulating sidewall (the insulating layer 36) which is formed at the end portion of the semiconductor layer is not always necessary to be formed but is preferably provided to prevent a short circuit between the end portion of the semiconductor layer 32 and the conductive layer 34 which serves as a gate electrode and thus to prevent leak current from flowing. Therefore, the insulating layer 36 may be formed at least at a side surface (an exposed section) of the channel formation region 32a of the semiconductor layer 32. Note that the insulating layer 36 may of course be formed at other sections. In this embodiment mode, the insulating layer 36 is formed on the lower side (the substrate side) of the gate insulating layer 33 to be in contact with the gate insulating layer 33.

Next, an example of a method for manufacturing the semiconductor device shown in FIGS. 1A to 1C will be described with reference to the drawings. Note that manufacturing steps which relate to the cross section taken along the broken line joining A and B in FIG. 1A are described with reference to FIGS. 2A and 2B, and FIG. 3.

Figure 2A:
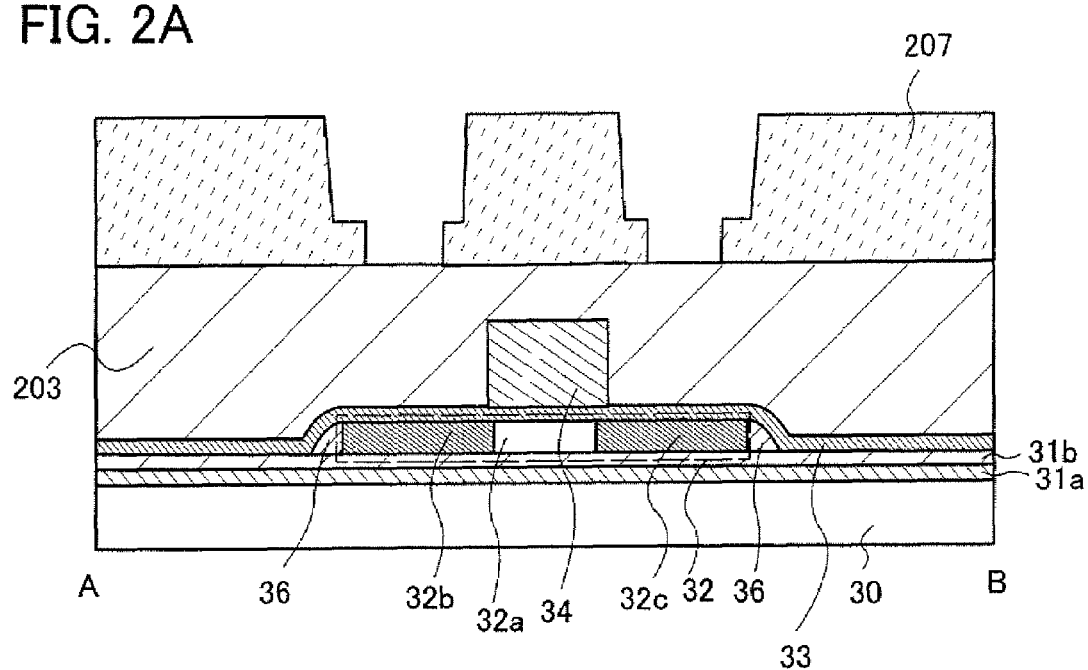
FIGS. 2A and 2B are cross-sectional views for explaining manufacturing steps of a semiconductor device of the present invention

First, the insulating layer 31 is formed over the substrate 30 (FIG. 2A). In this embodiment mode, the insulating layer 31 has a two-layer structure of a first insulating layer 31a formed over the substrate 30 and a second insulating layer 31b formed over the first insulating layer 31a.

Then, the island-shaped semiconductor layer 32 and the insulating layer 36 which is in contact with the side surface of the semiconductor layer 32 are formed over the insulating layer 31; the gate insulating layer 33 is formed over the semiconductor layer 32 and the insulating layer 36; the conductive layer 34 which serves as a gate electrode is formed over the gate insulating layer 33; and the insulating layer 203 is formed to cover the conductive layer 304 and the gate insulating layer 33 (FIG. 2A).

Next, a resist 207 is formed over the insulating layer 203 as selected. In this embodiment mode, the resist 207 is uneven in thickness and has a step portion at the side surface. That is, the resist 207 has a thin part and a thick part, and the thin part and the thick part make the step portion. As the resist 207, a positive photoresist, a negative photoresist, or the like can be selected as appropriate and used. Note that the shape and the number of steps at the step portion formed at the side surface of the resist can be selected as appropriate in accordance with the shape of the contact hole to be formed later.

Then, with the resist 207 as a mask, the insulating layer 203 and the gate insulating layer 33 are etched by dry etching to form the contact holes which reach the semiconductor layer 32. That is, by the etching, part of the surface of the semiconductor layer 32 is exposed. There is no particular limitation on an etching gas in dry etching as long as the etching gas provides high etching selectivity of the insulating layer 203 and the gate insulating layer 33 with respect to the semiconductor layer 32 so that the semiconductor layer 32 is not etched. For example, a fluorine-based gas such as $CF_4$, $NF_3$, $SF_6$, or $CHF_3$; a mixed gas in which $O_2$ gas, $H_2$ gas, or an inert gas such as He or Ar is added as appropriate to a fluorine-based gas; or the like can be used. Preferably, a mixed gas containing $CHF_3$ and He, a mixed gas containing $CF_4$ and $O_2$, or a mixed gas containing $CHF_3$, He, and $H_2$ is used.

Figure 2B:
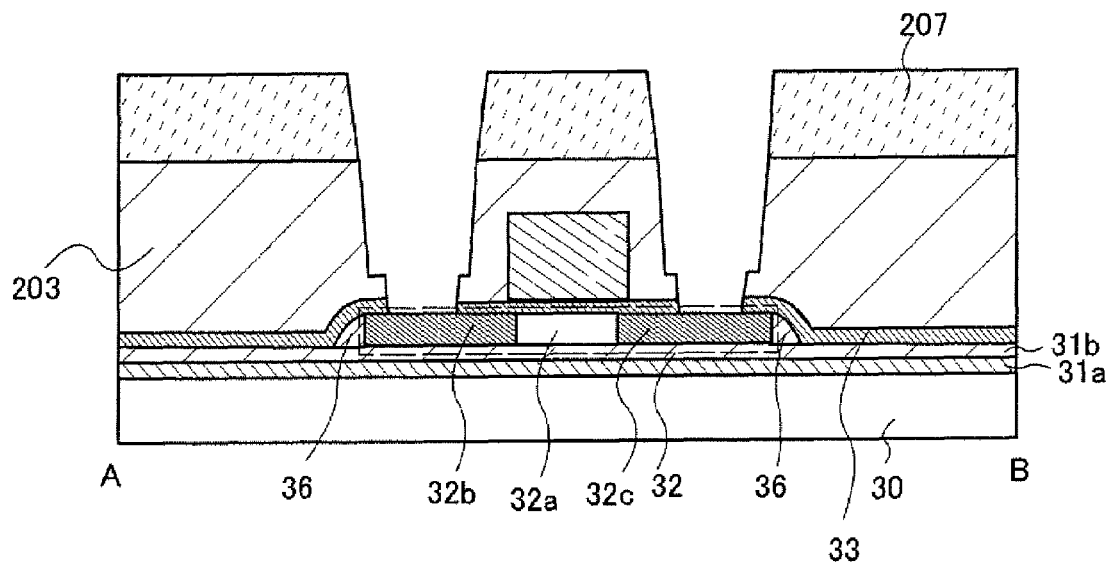

When the insulating layer 203 and the gate insulating layer 33 are etched by dry etching with the resist 207 as a mask, the resist 207 is also gradually etched. In this embodiment mode, since the step portion is formed at the side surface of the resist 207, the thin part of the resist is etched and removed earlier than the thick part of the resist, and thus, etching progresses at the insulating layer 203 in a region below the thin part of the resist (FIG. 2B). Consequently, the contact hole is formed not only in a region over which the resist 207 is not formed but also in a region below the thin part of the resist 207. That is, etching of the insulating layer 203 progresses partway in the region below the thin part of the resist 207, so that the step portion is formed at the side surface of the insulating layer 203.

Figure 3:
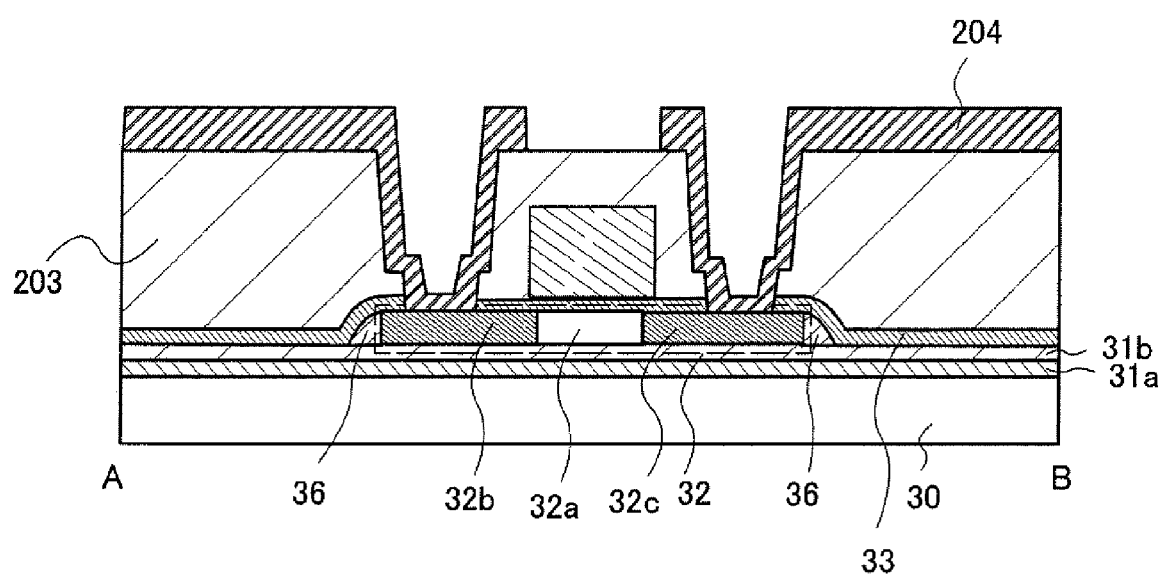
FIG. 3 is a cross-sectional view for explaining a manufacturing step of a semiconductor device of the present invention.

Next, a conductive material is formed over the insulating layer 203 and in the contact holes which are formed in the insulating layer 203 and the gate insulating layer 33, so that the conductive layers 204 which are electrically connected to the impurity regions 32b and 32c of the semiconductor layer 32 at the surfaces of the impurity regions 32b and 32c are formed (FIG. 3).

Through the above manufacturing steps, the semiconductor device shown in FIGS. 1A to 1C can be manufactured.

In the semiconductor device described in this embodiment mode, since the contact hole is formed using the resist which has the step portion at the side surface as a mask, the contact hole having the step portion at the side surface of the insulating layer 203 can be formed by one etching process. The step portion is formed at the side surface of the contact hole which is formed in the insulating layer 203; thus, the conductive layer 204 can adequately cover the side surface of the insulating layer 203. Accordingly, variation in thickness or disconnection of the conductive layer 204 can be prevented, and variation in contact resistance can be suppressed. Therefore, a semiconductor device with favorable characteristics can be easily manufactured without increasing the number of masks and manufacturing steps.

Figure 5:
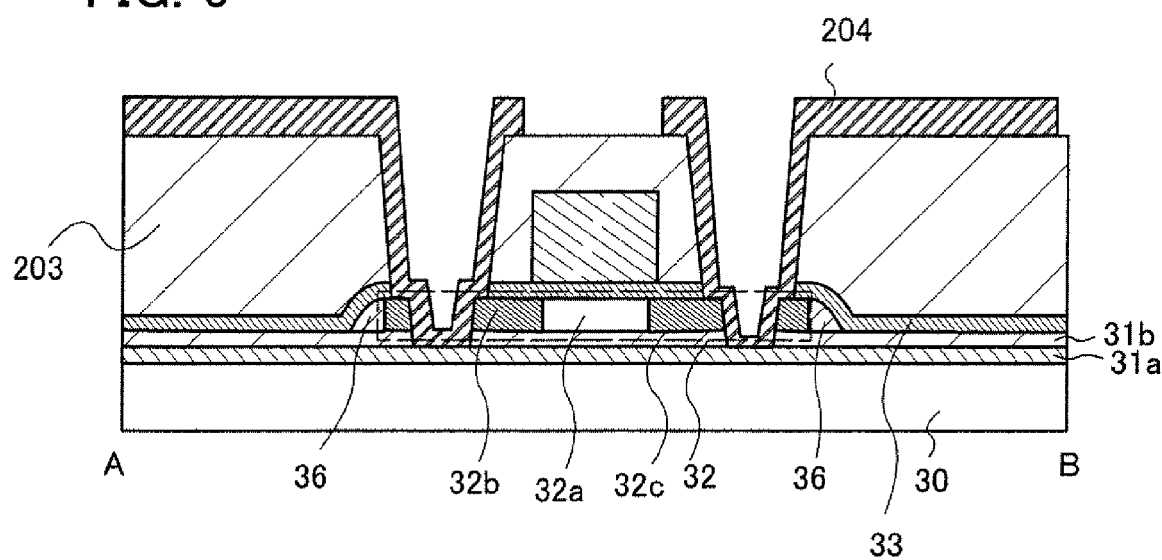
FIG. 5 is a cross-sectional view for explaining a manufacturing step of a semiconductor device of the present invention.

Note that the semiconductor device according to the present invention is not limited to the one shown in FIGS. 1A to 1C; for example, a structure as shown in FIG. 5 may be employed.

In the semiconductor device shown in FIG. 5, an insulating layer 203, a gate insulating layer 33, impurity regions 32b and 32c of a semiconductor layer 32, and an insulating layer 31b are etched to form contact holes (also referred to as openings) which reach an insulating layer 31a, and then, conductive layers 204 are formed over the insulating layer 203 and in the contact holes. The opening formed in the semiconductor layer 32 is smaller than that formed in the insulating layer 203. That is, in this embodiment mode, the conductive layers 204 and the impurity regions 32b and 32c are electrically connected to each other at part of the surfaces of the impurity regions 32b and 32c and at the side surfaces of the contact holes which are formed in the impurity regions 32b and 32c.

Hereinafter, manufacturing steps of the semiconductor device shown in FIG. 5 will be described.

Figure 4A:
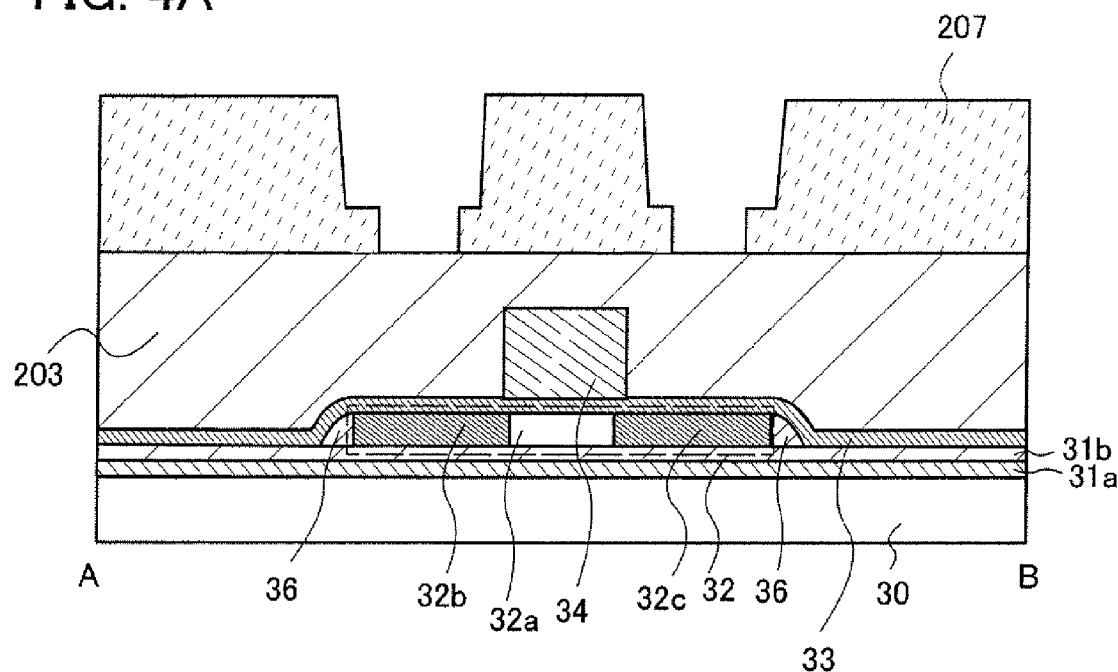
FIGS. 4A and 4B are cross-sectional views for explaining manufacturing steps of a semiconductor device of the present invention.

First, a resist 207 is formed over the insulating layer 203 as selected similarly to that in FIG. 2A (FIG. 4A). A resist similar to that described with reference to FIGS. 2A and 2B can be used as the resist 207.

Then, with the resist 207 as a mask, the insulating layer 203, the gate insulating layer 33, the semiconductor layer 32, and the insulating layer 31b are etched by dry etching to form the contact holes which reach the insulating layer 31a. That is, by the etching, part of the surface of the insulating layer 31a is exposed. There is no particular limitation on an etching gas in dry etching, and a fluorine-based gas such as $CF_4$, $NF_3$, $SF_6$, or $CHF_3$; a mixed gas in which $O_2$ gas, $H_2$ gas, or an inert gas such as He or Ar is added as appropriate to the fluorine-based gas; or the like can be used. Preferably, a mixed gas containing $CF_4$ and $O_2$, a mixed gas containing $SF_6$ and $O_2$, a mixed gas containing $CHF_3$ and He, a mixed gas containing $CHF_3$, He, and $H_2$, or a mixed gas containing $CF_4$ and $H_2$ is used.

Figure 4B:
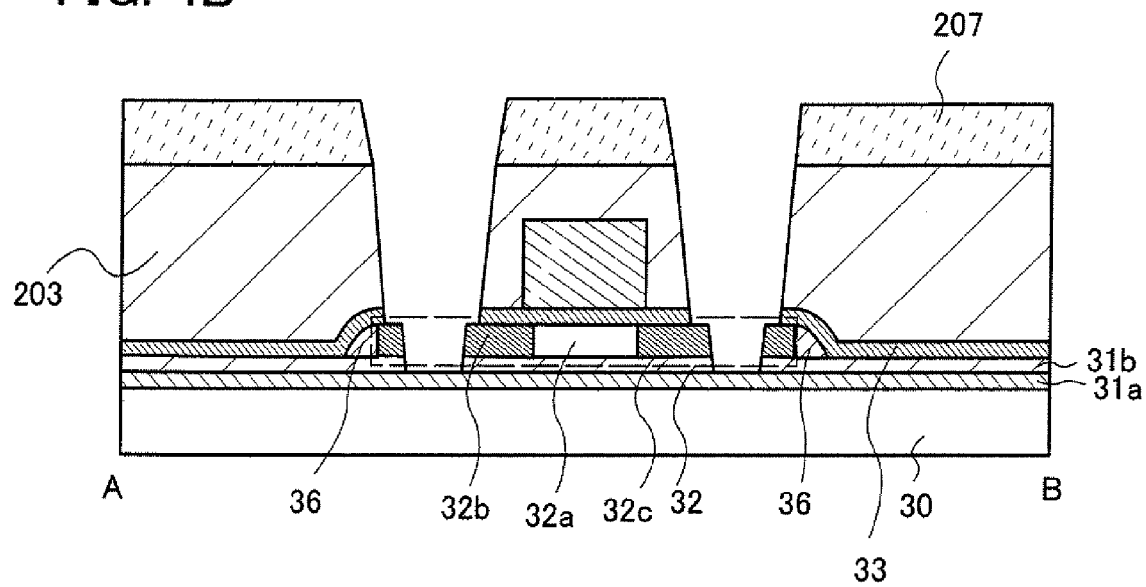

When the insulating layer 203, the gate insulating layer 33, the semiconductor layer 32, and the insulating layer 31b are etched by dry etching with the resist 207 as a mask, the resist 207 is also gradually etched. In this embodiment mode, since the step portion is formed at the side surface of the resist 207, the thin part of the resist is etched and removed earlier than the thick part of the resist, and thus, etching progresses at the insulating layer 203 and the gate insulating layer 33 in a region below the thin part of the resist (FIG. 4B). Consequently, the contact hole is formed not only in a region over which the resist 207 is not formed but also in a region below the thin part of the resist 207. That is, in this embodiment mode, the contact hole formed in the semiconductor layer 32 is smaller than that formed in the insulating layer 203 and the gate insulating layer 33, so that the step portion is formed by the side surface of the gate insulating layer 33 and the surface of the semiconductor layer 32.

Next, a conductive material is formed over the insulating layer 203 and in the contact holes which are formed in the insulating layer 203, the gate insulating layer 33, the semiconductor layer 32, and the insulating layer 31b, so that the conductive layers 204 which are electrically connected to the impurity regions 32b and 32c of the semiconductor layer 32 are formed (FIG. 5).

In the semiconductor device shown in FIG. 5, since the contact hole is formed using the resist which has the step portion at the side surface as a mask, the contact holes having different sizes can be formed in the insulating layer 203 and the semiconductor layer 32 by one etching process. The step portion is formed by the insulating layer 203 and the gate insulating layer 33, and the semiconductor layer 32; thus, the conductive layer 204 can adequately cover the side surface of the contact hole. Accordingly, variation in thickness or disconnection of the conductive layer 204 can be prevented, and variation in contact resistance can be suppressed. Therefore, a semiconductor device with favorable characteristics can be easily manufactured without increasing the number of masks and manufacturing steps.

In the semiconductor device shown in FIG. 5, since it is not necessary to stop etching at the surface of the semiconductor layer, the etching in formation of the contact hole can be easily controlled. Thus, a semiconductor device in which deterioration of characteristics is suppressed can be easily manufactured.

Although the contact hole is formed so that part of the surface of the insulating layer 31a or the semiconductor layer 32 is exposed in this embodiment mode, the present invention is not limited thereto. For example, part of the surface of the insulating layer 31b or the substrate 30 may be exposed. Further, the step portion formed at the side surface of the contact hole is formed not only in the position shown in this embodiment mode, but can be formed in positions which are selected as appropriate by a practitioner of the present invention. For example, the step portion may be formed by the side surface of the insulating layer 203 and the surface of the gate insulating layer 33, by the side surface of the gate insulating layer 33 and the surface of the semiconductor layer 32, by the side surface of the semiconductor layer 32 and the surface of the insulating layer 31b, or at the side surface of the semiconductor layer 32, the insulating layer 31a or 31b, or the gate insulating layer 33.

Embodiment Mode 2

In this embodiment mode, manufacturing steps of the semiconductor device shown in FIGS. 1A to 1C or FIG. 5 will be specifically described. In this embodiment mode, manufacturing steps which relate to the cross section taken along the broken line joining A and B in FIG. 1A are described with reference to FIGS. 6A to 6D and 7A to 7C, and manufacturing steps which relate to the cross section taken along the broken line joining C and D in FIG. 1A are described with reference to FIGS. 6E to 6H and 7D to 7F.

Figure 6A:
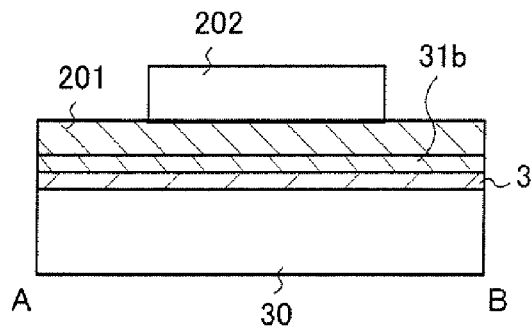
FIGS. 6A to 6H are cross-sectional views for explaining manufacturing steps of a semiconductor device of the present invention.
Figure 6E:
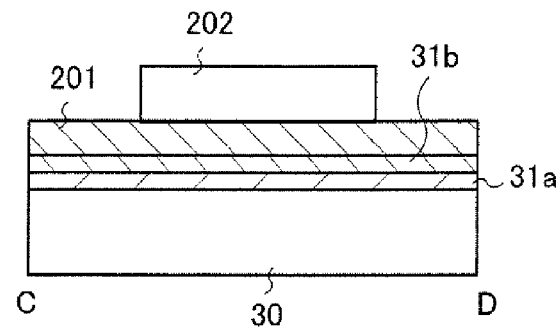

First, the insulating layer 31 is formed over the substrate 30 (FIGS. 6A and 6E). In this embodiment mode, the insulating layer 31 has a two-layer structure of the first insulating layer 31a formed over the substrate 30 and the second insulating layer 31b formed over the first insulating layer 31a.

As the substrate 30, a glass substrate, a quartz substrate, a metal substrate (for example, a ceramic substrate or a stainless steel substrate), a semiconductor substrate such as a Si substrate, or the like can be used. Alternatively, a plastic substrate formed of polyethylene terephthalate (PET), polyethylene naphthalate (PEN), polyether sulfone (PES), acrylic, or the like can be used.

The insulating layer 31 can be formed of an insulating material such as silicon oxide, silicon nitride, silicon oxynitride ($SiO_xN_y$, where $x>y>0$), or silicon nitride oxide ($SiN_xO_y$, where $x>y>0$), by a CVD method, a sputtering method, or the like. For example, a silicon nitride oxide film may be formed as the first insulating layer 31a and a silicon oxynitride film may be formed as the second insulating layer 31b. Alternatively, a silicon nitride film may be formed as the first insulating layer 31a and a silicon oxide film may be formed as the second insulating layer 31b. Providing the insulating layer 31 can prevent impurities such as alkali metals from diffusing from the substrate 30 and contaminating an element which is formed thereover.

Then, a semiconductor film 201 is formed over the insulating layer 31. The semiconductor film 201 can be formed of an amorphous semiconductor film or a crystalline semiconductor film. As a crystalline semiconductor film, a film formed by crystallizing an amorphous semiconductor film which is formed over the insulating layer 31 using thermal treatment or laser light irradiation, or the like can be used. Note that silicon is preferable as a semiconductor material. Alternatively, a silicon germanium semiconductor or the like can be used.

The semiconductor film 201 has a thickness of 10 to 200 nm, preferably, approximately 10 to 50 nm, more preferably, approximately 10 to 30 nm. Note that in the case of forming the semiconductor film 201 with a thickness of 50 nm or less, the semiconductor film 201 can be formed with a thickness of approximately 10 to 50 nm by forming a semiconductor film with a thickness of 50 nm or more and then dry-etching the surface of the semiconductor film. As an etching gas for the etching, a chlorine-based gas such as $Cl_2$, $BCl_3$, or $SiCl_4$; a fluorine-based gas such as $CF_4$, $NF_3$, $SF_6$, or $CHF_3$; a mixed gas in which $O_2$ gas, $H_2$ gas, or an inert gas such as He or Ar is added as appropriate to a fluorine-based gas; or the like can be used. Note that before the dry etching is performed, the surface of the semiconductor film may be treated with dilute hydrofluoric acid to remove a natural oxide film formed on the surface of the semiconductor film and then the surface of the semiconductor film may be treated with ozone water or the like to form an oxide film on the surface of the semiconductor film.

By forming the semiconductor film 201 as a thin film with a thickness of approximately 50 nm or less, failure in covering the surface of the semiconductor layer by the gate insulating layer can be reduced. Further, by forming the semiconductor film 201 as a thin film, further miniaturization of a TFT can be achieved. Moreover, even when the amount of an impurity element added to a channel formation region is increased in order to control the threshold voltage of a TFT, it is easier to manufacture a complete depletion type TFT by forming the semiconductor film 201 as a thin film, and thus, a TFT whose threshold voltage is controlled while keeping a good subthreshold swing can be manufactured.

When a film formed by crystallizing or recrystallizing an amorphous semiconductor film by laser light irradiation is used as the semiconductor film 201, an LD-pumped continuous wave (CW) laser ($YVO_4$, second harmonic (wavelength of 532 nm)) can be used as a light source of the laser light. Although the wavelength is not specifically limited to the second harmonic, the second harmonic is superior to harmonics higher than that in terms of energy efficiency. When a semiconductor film is irradiated with CW laser light, energy is continuously applied to the semiconductor film. Therefore, once the semiconductor film is converted to a melted state, the melted state can be maintained. Further, by scanning the semiconductor film with CW laser light, a solid-liquid interface of the semiconductor film can be moved, and crystal grains which are long in one direction, which matches the direction of the movement, can be formed. A reason for using a solid-state laser is that compared to a gas laser or the like, a solid-state laser has more stable power output, so more stable treatment can be expected. Note that the laser light source is not limited to a CW laser. A pulsed laser with a repetition rate of 10 MHz or more can also be used. When a pulsed laser with a high repetition rate is used, if a pulse interval of the laser is shorter than the time it takes for a semiconductor film to solidify after being melted, the semiconductor film can be maintained in a melted state, and by moving the solid-liquid interface, a semiconductor film with crystal grains which are long in one direction can be formed. It is also possible to employ another type of CW laser or pulsed laser with a repetition rate of 10 MHz or more. For example, a gas laser such as an Ar laser, a Kr laser, or a $CO_2$ laser can be used. A solid-state laser such as a YAG laser, a YLF laser, a $YAlO_3$ laser, a $GdVO_4$ laser, a KGW laser, a KYW laser, an alexandrite laser, a Ti:sapphire laser, a $Y_2O_3$ laser, or a $YVO_4$ laser can be used. Further, a ceramic laser such as a YAG laser, a $Y_2O_3$ laser, a $GdVO_4$ laser, or a $YVO_4$ laser can also be used. A metal vapor laser such as a helium-cadmium laser or the like can be used. It is preferable to emit laser light from a laser oscillator using $TEM_{00}$ (single transverse mode), since by doing so, the energy uniformity of a linear beam spot obtained on a surface that is irradiated can be increased. Further, a pulsed excimer laser can also be used.

Figure 6B:
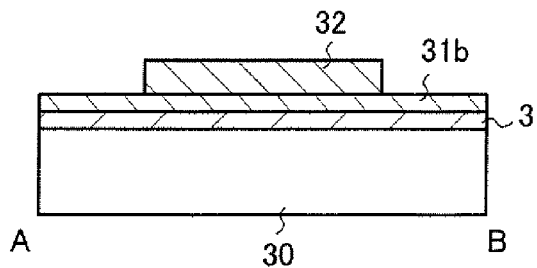
Figure 6F:
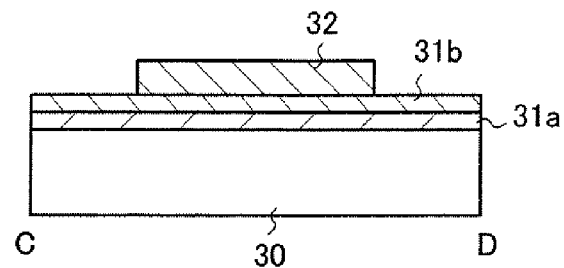

Next, a resist 202 is formed over the semiconductor film 201 as selected (FIGS. 6A and 6E). Then, the resist 202 is used as a mask and the semiconductor film 201 is etched by dry etching to form the island-shaped semiconductor layer 32 (FIGS. 6B and 6F). Note that the resist 202 is used as a mask during etching, and a positive photoresist, a negative photoresist, or the like can be selected as appropriate and used for the resist 202.

As an etching gas for the dry etching, a fluorine-based gas such as $CF_4$, $NF_3$, or $SF_6$; a mixed gas in which $O_2$ gas or an inert gas such as He or Ar is added as appropriate to the fluorine-based gas; or the like can be used. Preferably, a mixed gas containing $CF_4$ and $O_2$ or a mixed gas containing $SF_6$ and $O_2$ is used. Without limitation to the above gas, a chlorine based gas such as $Cl_2$, $BCl_3$ or $SiCl_4$ or a bromine based gas such as HBr may be used. Further, the etching is not limited to dry etching; wet etching may be used. In that case, the island-shaped semiconductor layer 32 can be formed by wet-etching the semiconductor film 201 using an organic alkaline aqueous solution typified by TMAH (tetramethylammonium hydroxide). Note that when TMAH or the like is used as an etchant, because only the semiconductor film 201 is etched as selected, etching can be performed without damaging the base insulating layer 31. When a semiconductor layer formed over an insulating surface is separated into island shapes in this manner, elements can be separated from each other in the case where a plurality of thin film transistors and peripheral circuits are formed over the same substrate.

The semiconductor layer 32 may be formed such that the end portion has a perpendicular shape or a tapered shape. The shape of the end portion of the semiconductor layer 32 can be selected as appropriate by changing the etching condition or the like. It is preferable to form the semiconductor layer 32 such that the taper angle of the end portion is 45° or more and less than 95°, and more preferably 60° or more and less than 95°. By making the end portion of the semiconductor layer 32 a shape almost perpendicular, a parasitic channel can be reduced.

Then, the resist 202 formed over the semiconductor layer 32 is removed.

Figure 6C:
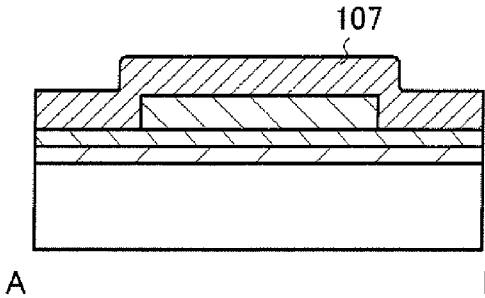
Figure 6G:
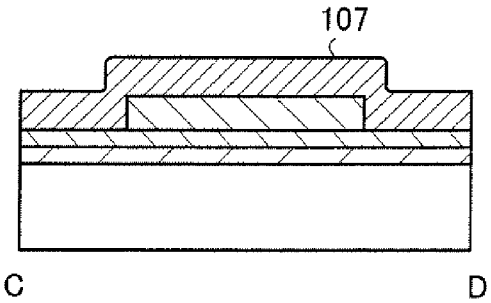

Next, an insulating layer 107 (hereinafter also referred to as a third insulating layer 107) is formed to cover the semiconductor layer 32 (FIGS. 6C and 6G). The third insulating layer 107 is formed by a CVD method or a sputtering method, using a material such as silicon oxide, silicon nitride, silicon oxynitride, silicon nitride oxide, SiOF, SiOC, DLC, porous silica, or the like.

Further, the third insulating layer 107 is formed to a thickness so that the end portion of the semiconductor layer 32 can be sufficiently covered. The thickness of the third insulating layer 107 is preferably in the range of 1.5 to 3 times larger than that of the semiconductor layer 32 formed below the third insulating layer 107.

Figure 6D:
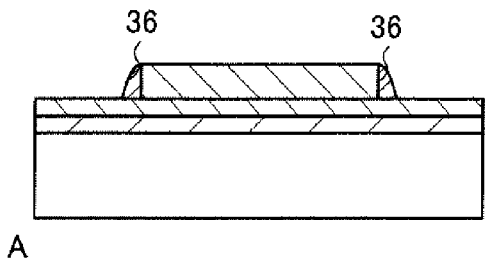
Figure 6H:
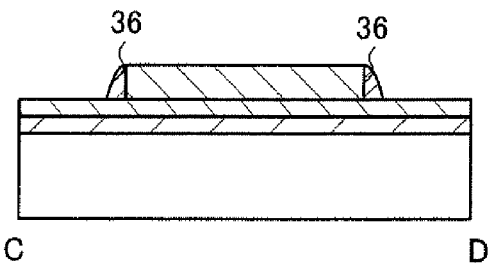

Next, the third insulating layer 107 is etched as selected by anisotropic etching mainly in a perpendicular direction to form the insulating layer 36 (hereinafter also referred to as the fourth insulating layer 36) which is in contact with the side surface of the semiconductor layer 32 (FIGS. 6D and 6H).

In the anisotropic etching mainly in a perpendicular direction of the third insulating layer 107, the etching progresses gradually from the third insulating layer 107 formed in the region over the one surface of the semiconductor layer 32 and over the insulating layer 31b. Note that the third insulating layer 107 with an almost uniform thickness is formed over the one surface of the semiconductor layer 32 and over the insulating layer 31b. Therefore, by stopping the etching when the one surface of the semiconductor layer 32 is exposed, the third insulating layer 107 can be left just in the region which is in contact with the side surface of the semiconductor layer 32 and the periphery thereof. The left third insulating layer 107 corresponds to the fourth insulating layer 36. Note that by making the end portion of the semiconductor layer 32 an almost perpendicular shape, the third insulating layer 107 can be easily left just in the region which is in contact with the side surface of the semiconductor layer 32 and in the periphery thereof. That is, the fourth insulating layer 36 can be easily formed.

There is no particular limitation on the etching method of the third insulating layer 107 as long as anisotropic etching mainly in a perpendicular direction can be performed. For example, reactive ion etching (RIE) can be used. The reactive ion etching is classified depending on a plasma generation method into a parallel-plate type, a magnetron type, a dual-frequency type, an ECR type, a helicon type, an ICP type, and the like. As an etching gas used at this time, a gas which can provide high etching selectivity of the third insulating layer 107 with respect to other layers (such as the semiconductor layer 32) is preferably selected. In the case of etching the insulating film as selected, a fluorine-based gas such as $CHF_3$, $CF_4$, $C_4F_8$, $C_2F_6$, $NF_3$, or the like can be used, for example. Further, an inert gas such as helium (He), argon (Ar), or xenon (Xe); an $O_2$ gas; or an $H_2$ gas may be added as appropriate.

The shape of the fourth insulating layer 36 can be changed by selecting the material for forming the thin film, the etching condition, or the like as appropriate. In this embodiment mode, the fourth insulating layer 36 is formed such that the perpendicular height from the bottom surface (the surface which is in contact with the insulating layer 31b) is almost the same as that of the semiconductor layer 32. Further, the fourth insulating layer 36 is formed such that the surface thereof on the side which is not in contact with the side surface of the semiconductor layer 32 is curved. Specifically, it is formed such that an appropriate curvature is provided and the surface is curved convexly with respect to the side surface of the semiconductor layer 32 being in contact with. Of course, the present invention is not limited particularly thereto, and the fourth insulating layer 36 may have a shape having a corner instead of a rounded shape. Preferably, the corner portion of the fourth insulating layer 36 is made a gentle shape so that the coverage by a layer formed thereover (here, the insulating layer 33) can be improved. Note that the etching condition means an amount of electric power which is applied to an electrode provided for a substrate, the temperature of the electrode provided for the substrate, the pressure in a chamber, and the like in addition to the kind of etching gas and a gas flow rate.

Figure 7A:
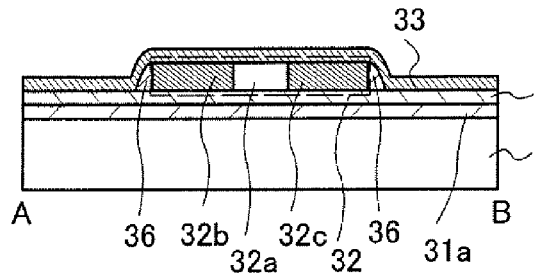
FIGS. 7A to 7F are cross-sectional views for explaining manufacturing steps of a semiconductor device of the present invention.
Figure 7D:
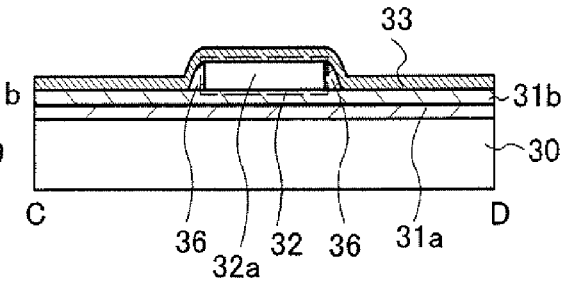

Next, the insulating layer 33 (hereinafter also referred to as the fifth insulating layer 33) is formed over the semiconductor layer 32 and the fourth insulating layer 36 (FIGS. 7A and 7D). The fifth insulating layer 33 is formed by a CVD method or a sputtering method, using a material such as silicon oxide, silicon nitride, silicon oxynitride, silicon nitride oxide, aluminum nitride, or the like. Further, the fifth insulating layer 33 is formed to have a single layer structure or a stacked-layer structure of at least one of the above materials. The fifth insulating layer 33 is formed to have a thickness in the range of 1 to 50 nm, preferably 1 to 20 nm, and more preferably 1 to 10 nm.

Note that a method for forming the insulating layer 36 is not limited to the one described in this embodiment mode, and the insulating layer 36 may be formed by performing plasma treatment in an atmosphere containing oxygen or wet oxidation to the end portion of the semiconductor layer 32. In such a case, preferably, after the insulating layer 33 is formed over the semiconductor layer 32, the insulating layer 33 in a region which covers the end portion of the semiconductor layer 32 is removed and an exposed portion of the semiconductor layer 32 is subjected to plasma treatment or wet oxidation to form the insulating layer 36.

In the case of wet oxidation, the surface of the semiconductor layer 32 is treated with an aqueous solution containing ozone, an aqueous solution containing hydrogen peroxide, an aqueous solution containing sulfuric acid, an aqueous solution containing iodic acid, or an aqueous solution containing nitric acid, and an oxide film formed at a portion where the semiconductor layer 32 is exposed can be used as the insulating layer 36. The aqueous solution containing ozone, the aqueous solution containing hydrogen peroxide, the aqueous solution containing sulfuric acid, the aqueous solution containing iodic acid, or the aqueous solution containing nitric acid may contain acetic acid or oxalic acid.

Further, plasma treatment can be performed in an atmosphere containing oxygen, for example, in a mixed gas atmosphere containing oxygen ($O_2$) and a rare gas (including at least one of He, Ne, Ar, Kr, and Xe); a mixed gas atmosphere containing oxygen, hydrogen ($H_2$), and a rare gas; a mixed gas atmosphere containing dinitrogen monoxide and a rare gas; or a mixed gas atmosphere containing dinitrogen monoxide, hydrogen, and a rare gas. For example, a mixed gas containing oxygen ($O_2$), hydrogen ($H_2$), and argon (Ar) can be used. In that case, a mixed gas containing oxygen of 0.1 to 100 sccm, hydrogen of 0.1 to 100 sccm, and argon of 100 to 5000 sccm may be used. Note that the mixed gas with an oxygen:hydrogen:argon ratio of 1:1:100 is preferably introduced. For example, oxygen of 5 sccm, hydrogen of 5 sccm, and argon of 500 sccm may be introduced.

Further, plasma treatment can be performed in an atmosphere containing nitrogen, for example, in a mixed gas atmosphere containing nitrogen ($N_2$) and a rare gas (including at least one of He, Ne, Ar, Kr, and Xe); a mixed gas atmosphere containing nitrogen, hydrogen, and a rare gas; or a mixed gas atmosphere containing ammonia ($NH_3$) and a rare gas.

Note that the plasma treatment may be performed in the above gas atmosphere using a plasma in which the electron density is $1 \times 10^{11}$ cm$^{-3}$ or more and the electron temperature is 1.5 eV or less. More specifically, a plasma in which the electron density is $1 \times 10^{11}$ cm$^{-3}$ or more and $1 \times 10^{13}$ cm$/^{-3}$ or less and the electron temperature is 0.5 eV or more and 1.5 eV or less is used. In the plasma, the electron density is high and the electron temperature in the periphery of an object to be treated (here, the semiconductor layer 32) which is formed over the substrate 30 is low; therefore, the object to be treated can be prevented from being damaged by the plasma. In addition, because the plasma has a high electron density of $1\times10^{11}$ cm$^{-3}$ or more, an oxide film or nitride film formed by oxidizing or nitriding the object to be treated using the plasma treatment can have superior uniformity of film thickness and the like and can be denser, compared to a film formed by a CVD method, a sputtering method, or the like. Further, since the plasma has low electron temperatures of 1.5 eV or less, oxidation or nitridation can be performed at lower temperature than conventional plasma treatment or a thermal oxidation method. For example, oxidation can be performed sufficiently even when the plasma treatment is performed at temperature which is lower than the strain point of a glass substrate by 100° C. or more. Furthermore, as a frequency for producing plasma, a high frequency wave such as a microwave (e.g., a microwave with a frequency of 2.45 GHz) can be used.

Figure 7B:
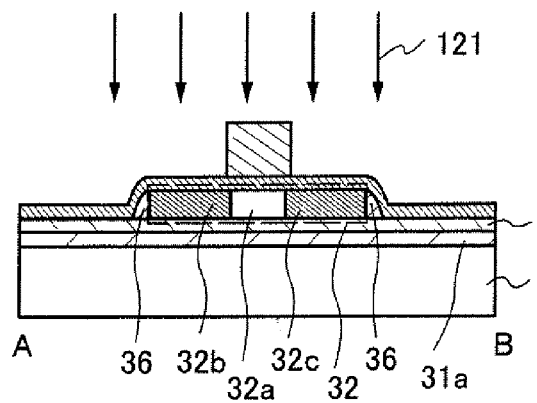
Figure 7E:
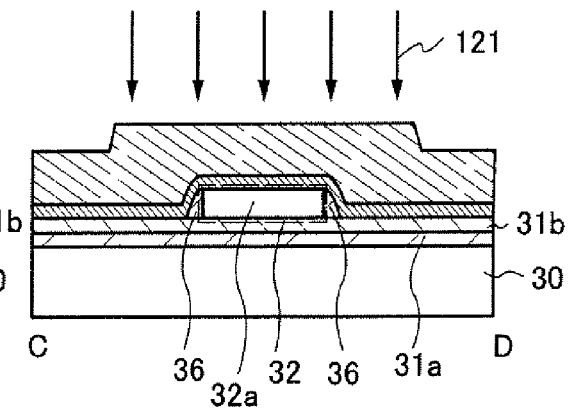

Next, the conductive layer 34 which serves as a gate electrode is formed over the gate insulating layer 33 (FIGS. 7B and 7E). In this embodiment mode, an example in which the conductive layer 34 is formed as a single layer is shown; however, the conductive layer 34 may of course have a structure in which two, three or more layers of conductive materials are stacked. Note that the conductive layer 34 can be formed by etching a conductive layer which is formed so as to cover the gate insulating layer 33 as selected, although this is not shown in the drawings.

The conductive layer 34 can be formed using an element such as tantalum (Ta), tungsten (W), titanium (Ti), molybdenum (Mo), aluminum (Al), copper (Cu), chromium (Cr), niobium (Nb), or the like, or using an alloy material or a compound material containing any of such elements as a main component. Alternatively, the conductive layer 34 can be formed using a semiconductor material typified by polycrystalline silicon doped with an impurity element such as phosphorus. For example, in the case where the conductive layer 34 has a stacked-layer structure including a first conductive layer and a second conductive layer, tantalum nitride may be used as the first conductive layer and tungsten may be used as the second conductive layer. Note that the conductive layer 34 is not limited to this combination. When the conductive layer 34 is formed with a stacked-layer structure, the conductive layer 34 can be provided by freely combining any of the materials described above.

Next, by using the conductive layer 34 as a mask and introducing an impurity element 121 into the semiconductor layer 32, the impurity regions 32b and 32c and the channel formation region 32a into which the impurity element 121 is not introduced are formed in the semiconductor layer 32 (FIGS. 7B and 7E). Note that in this embodiment mode, because the impurity element is introduced after the conductive layer 34 is formed so as to go across the island-shaped semiconductor layer 32, the impurity element is introduced to regions of the semiconductor layer 32 which are not covered with the conductive layer 34 to form the impurity regions 32b and 32c, and the channel formation region 32a into which the impurity element 121 is not introduced is formed in a region of the semiconductor layer 32 which is covered with the conductive layer 34.

In this embodiment mode, an impurity element which imparts n-type conductivity or an impurity element which imparts p-type conductivity can be used as the impurity element 121. As an impurity element which imparts n-type conductivity, phosphorus (P), arsenic (As), or the like can be used. As an impurity element which imparts p-type conductivity, boron (B), aluminum (Al), gallium (Ga), or the like can be used. For example, phosphorus (P) can be used as the impurity element 121 and introduced into the semiconductor layer 32 such that it is contained in the semiconductor layer 32 at a concentration of $1\times10^{18}$ to $1\times10^{21}$/cm$^3$ to form the impurity regions 32b and 32c which have n-type conductivity. Further, low-concentration impurity regions (LDD regions), to which an impurity element is added at a lower concentration than that of the impurity regions 32b and 32c each of which serves as a source region or a drain region, may be formed between the channel formation region 32a and the impurity regions 32b and 32c. By providing a low-concentration impurity region, an electric field between the channel formation region 32a and the impurity region 32b or 32c can be reduced, and degradation caused by repetition of writing and erasing can be suppressed.

Further, an impurity element which has the opposite conductivity type to the impurity element added to the impurity regions 32b and 32c (e.g., boron, for an n-type TFT) may be added to the channel formation region 32a. When an impurity element with the opposite conductivity type is added to the channel formation region 32a, the threshold voltage of a TFT can be controlled. Note that this impurity element may be added by doping through the gate electrode, or may be added in advance before the gate electrode is formed.

Figure 7C:
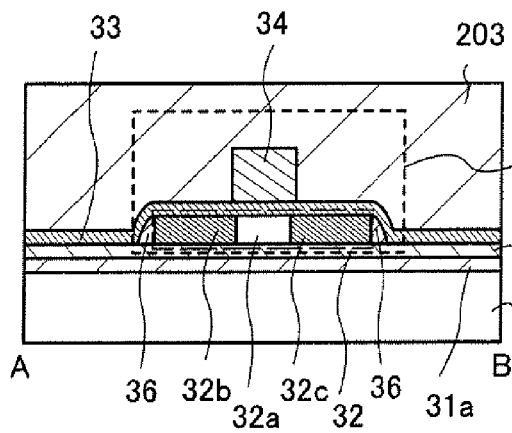
Figure 7F:
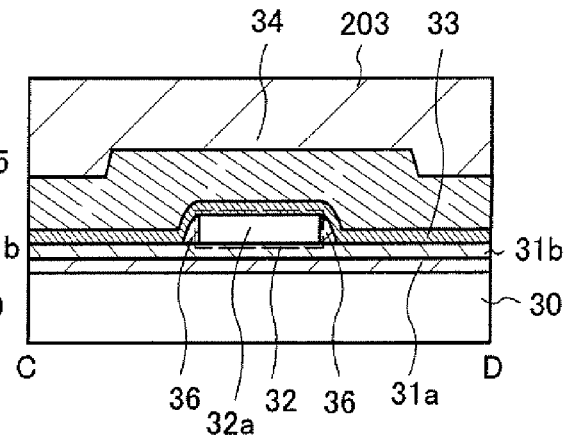

Then, the insulating layer 203 is formed so as to cover the conductive layer 34 and the gate insulating layer 33 (FIGS. 7C and 7F). As the insulating layer 203, silicon oxide, silicon oxynitride (SiO$_x$N$_y$, where x>y>0), silicon nitride oxide (SiN$_x$O$_y$, where x>y>0), or the like, which is formed by a CVD method, a sputtering method, or the like can be used. Alternatively, the insulating layer 203 can be a single layer structure or a stacked-layer structure which includes an organic material such as polyimide, polyamide, polyvinyl phenol, benzocyclobutene, acrylic, or epoxy; a siloxane material such as a siloxane resin; an oxazole resin; or the like. Note that a siloxane material corresponds to a material including a Si—O—Si bond. Siloxane is a material having a skeleton structure formed of bonds of silicon (Si) and oxygen (O). As a substituent, an organic group containing at least hydrogen (e.g., an alkyl group or aromatic hydrocarbon) can be used. Alternatively, a fluoro group can be used as the substituent. An oxazole resin is, for example, photosensitive polybenzoxazole or the like. Photosensitive polybenzoxazole is a material which has a low dielectric constant (a dielectric constant of 2.9 at 1 MHz at room temperature), high heat resistance (according to results of thermogravimetry-differential thermal analysis (TG-DTA), it has a thermal decomposition temperature of 550° C. at a rate of temperature increase of 5° C./min), and a low water absorption percentage (0.3% at room temperature over 24 hours). Compared to a relative dielectric constant of polyimide or the like (approximately 3.2 to 3.4), an oxazole resin has a lower dielectric constant (approximately 2.9). Therefore, when an oxazole resin is used, generation of parasitic capacitance can be suppressed, and high-speed operation is possible. In this embodiment mode, a single layer structure or a stacked-layer structure including silicon oxide, silicon oxynitride (SiO$_x$N$_y$, where x>y>0), and/or silicon nitride oxide (SiN$_x$O$_y$, where x>y>0) is formed by a CVD method as the insulating layer 203. Alternatively, the insulating layer 203 may be formed as a stacked layer including an organic material such as polyimide, polyamide, polyvinyl phenol, benzocyclobutene, acrylic, or epoxy; a siloxane material such as a siloxane resin; or an oxazole resin.

The subsequent manufacturing steps may be performed as described in Embodiment Mode 1, and thus, the semiconductor device shown in FIGS. 1A to 1C or FIG. 5 can be manufactured.

As the conductive layer 204, a single layer structure or a stacked-layer structure formed of one of elements of aluminum, tungsten, titanium, tantalum, molybdenum, nickel, and neodymium, or of an alloy containing a plurality of those elements, can be used. For example, as the conductive layer 204 formed of an alloy containing a plurality of the elements, an aluminum alloy containing titanium, an aluminum alloy containing neodymium, or the like can be used. Further, in the case where the conductive layer 204 is provided as a stacked-layer structure, a structure in which an aluminum layer or an aluminum alloy layer such as those described above is interposed between titanium layers may be employed, for example.

In this embodiment mode, since the contact hole having the step portion at the side surface can be formed by one etching process, the number of masks and manufacturing steps can be reduced. Therefore, a semiconductor device with favorable characteristics in which variation in thickness or disconnection of the source electrode or the drain electrode formed in the contact hole is prevented can be easily manufactured.

Further, in this embodiment mode, when the source electrode or the drain electrode is made in contact with the source region or the drain region at the side surface of the contact hole which is formed in the source region or the drain region, since it is not necessary to stop the etching at the surface of the semiconductor layer, the etching in formation of the contact hole can be easily controlled. Thus, a semiconductor device in which deterioration of characteristics is suppressed can be easily manufactured.

Further, the insulating layer may be selectively thickly provided at the end portion of the channel formation region of the semiconductor layer, so that electric field concentration at the end portion of the channel formation region of the semiconductor layer can be reduced. Accordingly, gate leakage faults can be reduced and the withstand voltage of the gate electrode can be enhanced.

Embodiment Mode 3

The semiconductor device according to the present invention can have various structures, not limited to those in Embodiment Modes 1 and 2. In this embodiment mode, a structure of a thin film transistor in which a semiconductor layer is partially made silicide and a method for manufacturing the thin film transistor will be described. FIGS. 5A to 5C show a structure of a semiconductor device of this embodiment mode. FIG. 5A is a top view, FIG. 8B shows a cross section taken along a broken line A-B in FIG. 8A, and FIG. 8C shows a cross section taken along a broken line C-D in FIG. 8A.

Figure 8A:
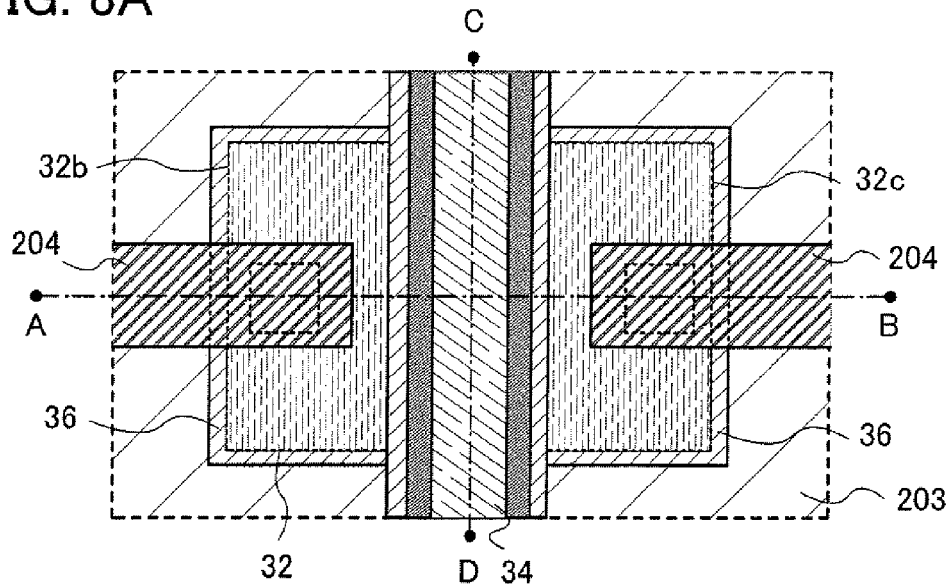
FIG. 8A is a top view and FIGS. 8B and 8C are cross-sectional views for explaining a structure of a semiconductor device of the present invention.
Figure 8B:
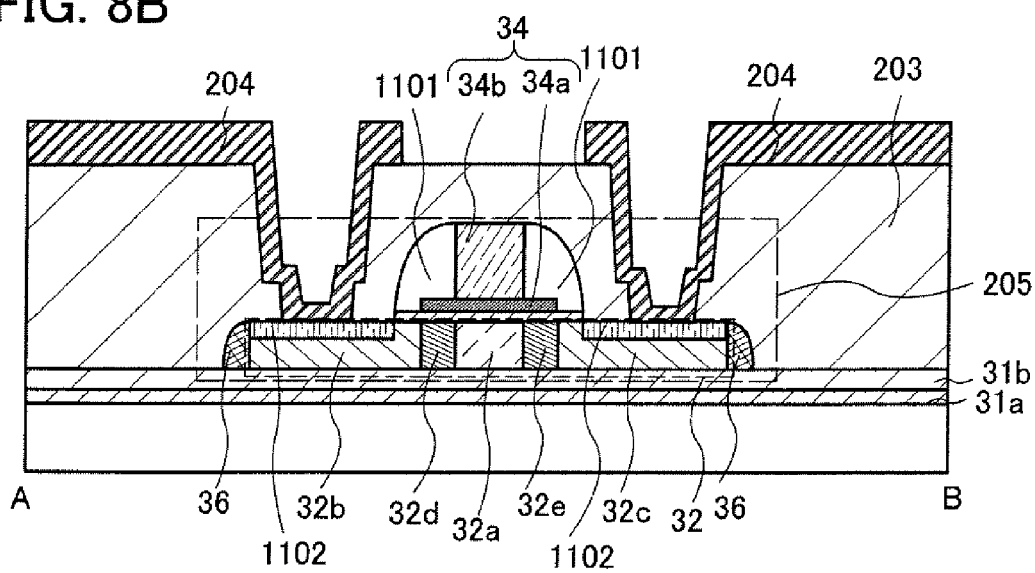
Figure 8C:
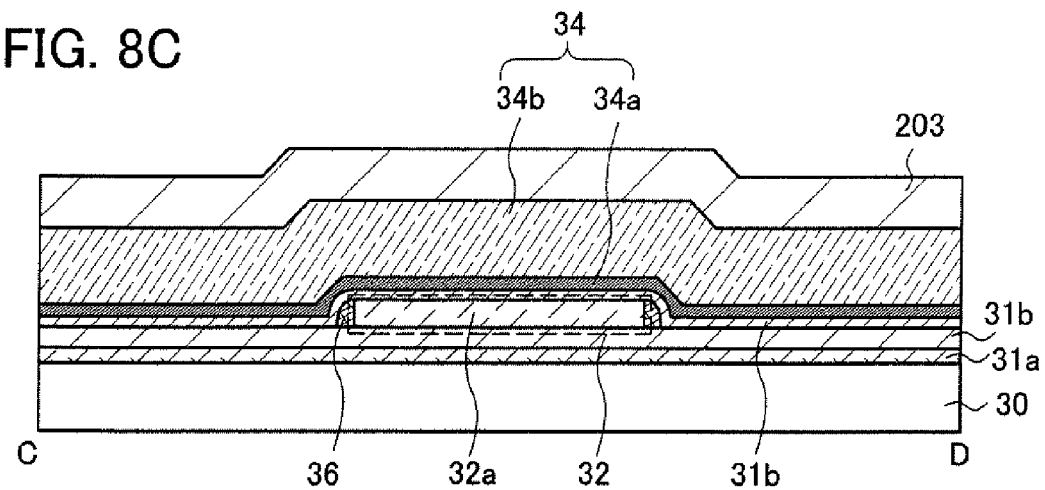

As shown in FIGS. 8A to 8C, in the semiconductor device of this embodiment mode, a silicide region 1102 is formed in part of the surface of a semiconductor layer 32 in addition to the structure shown in FIGS. 1A to 1C. In addition, a conductive layer 34 which serves as a gate electrode is formed of a stacked-layer structure of a first conductive layer 34a and a second conductive layer 34b. At the sidewalls of the conductive layer 34, insulating layers (also referred to as sidewall insulating layers) 1101 are formed. Further, between impurity regions 32b and 32c (also referred to as high-concentration impurity regions) each of which serves as a source region or a drain region and a channel formation region 32a, regions 32d and 32e, to which an impurity element is added at a lower concentration than that in the impurity regions 32b and 32c (also referred to as low-concentration impurity regions) are formed.

Next, a method for manufacturing the semiconductor device shown in FIGS. 8A to 8C will be described.

Figure 9A:
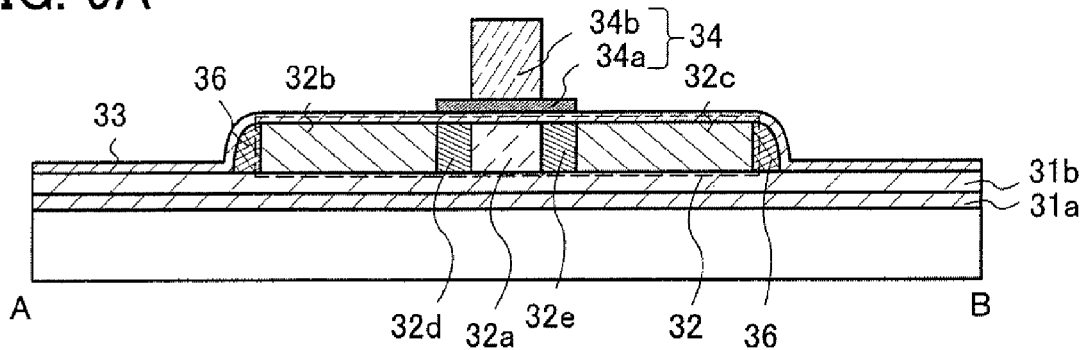
FIGS. 9A to 9D are cross-sectional views for explaining manufacturing steps of a semiconductor device of the present invention.

First, as in Embodiment Mode 2, insulating layers 31a and 31b are formed over a substrate 30; the semiconductor layer 32, an insulating layer 36, and a gate insulating layer 33 are formed over the insulating layer 31b; and the first conductive layer 34a and the second conducive layer 34b which serve as a gate electrode are formed over the gate insulating layer 33 (FIG. 9A). Next, an impurity element which imparts one conductivity type is added at a first concentration with the conductive layer 34b as a mask, and then, an impurity element is added at a second concentration with the conductive layers 34a and 34b as a mask, whereby the pair of high-concentration impurity regions 32b and 32c, the pair of low-concentration impurity regions 32d and 32e, and the channel formation region 32a are formed in a self-aligned manner. Here, as the impurity elements added at the first and second concentrations, impurity elements which impart the same conductivity type are added; for example, an impurity element which imparts p-type conductivity such as boron (B), aluminum (Al), or gallium (Ga) or an impurity element which imparts n-type conductivity such as phosphorus (P) or arsenic (As) can be used.

Further, in order to control the threshold voltage of a transistor, an impurity element which imparts one conductivity type may be added to the channel formation region 32a. Addition of the impurity element to the channel formation region 32a may be performed before the gate electrode 34 is formed. Further, after the impurity element which imparts one conductivity type is added, thermal treatment may be performed to activate the impurity element added. The thermal treatment can be performed by laser beam irradiation, RTA, or using an annealing furnace. Specifically, the thermal treatment may be performed at temperatures of 400 to 700° C., preferably, 500 to 650° C. Further, the thermal treatment is preferably performed in a nitrogen atmosphere.

Figure 9B:
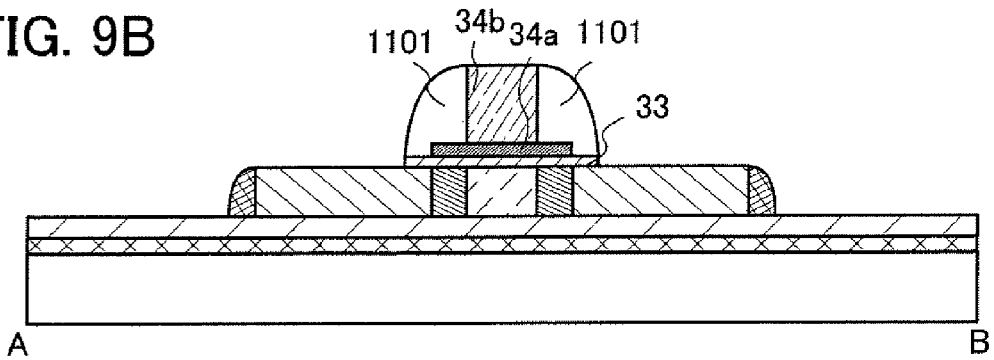

Next, the sidewall insulating layers 1101 which are in contact with the side surfaces of the conductive layers 34a and 34b are formed (FIG. 9B).

The sidewall insulating layers 1101 can be formed as follows: an insulating layer is formed over the conductive layers 34a and 34b and is etched as selected by anisotropic etching mainly in a perpendicular direction. For example, the sidewall insulating layers 1101 can be formed as follows: an insulating layer is formed of an inorganic material such as silicon oxide, silicon nitride, silicon oxynitride, or silicon nitride oxide, or an organic material such as an organic resin by a CVD method or a sputtering method to have a single layer structure or a stacked-layer structure, and then etched as selected. The sidewall insulating layer 1101 is used as a silicide mask in forming a silicide region later. In this embodiment mode, the surface of the sidewall insulating layer 1101 which is not in contact with the side surfaces of the conductive layers 34a and 34b is curved. Note that the sidewall insulating layer 1101 is formed to entirely cover the side surfaces of the conductive layers 34a and 34b forming the gate electrode 34.

Further, in this embodiment mode, the etching for forming the sidewall insulating layer 1101 also etches the insulating layer 33 in the lower layer to expose part of the semiconductor layer 32 as selected. Specifically, the high-concentration impurity regions 32b and 32c in the regions which do not overlap with the sidewall insulating layers 1101 are exposed. Note that, depending on the etching condition, the upper portion of the high-concentration impurity regions 32b and 32c may also be etched to reduce the thickness (it is called film thickness loss).

Figure 9C:
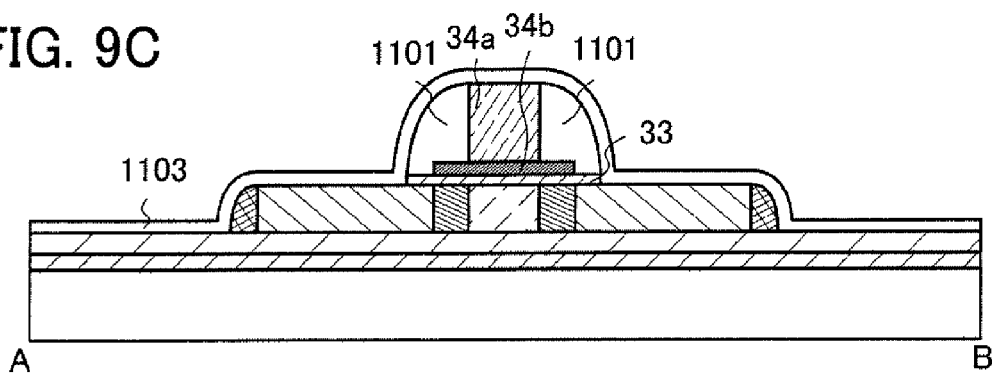

Next, a metal layer 1103 is formed on the exposed semiconductor layer 32 (FIG. 9C).

The metal layer 1103 may be formed at least on the exposed semiconductor layer 32. That is, the metal layer 1103 may be formed on the semiconductor layer 32 in the region which does not overlap with the sidewall insulating layer 1101. In this embodiment mode, the metal layer 1103 is formed so as to cover not only the exposed semiconductor layer 32 but also the sidewall insulating layers 1101 and the conductive layer 34. The metal layer 1103 is formed of a material which reacts with the semiconductor layer to form silicide. For example, a metal element such as nickel (Ni), titanium (Ti), cobalt (Co), or platinum (Pt), or an alloy material containing such a metal element can be used. The metal layer 1103 is formed of such a material by a sputtering method, an evaporation method, a plating method, or the like. The thickness of the metal layer 1103 is needed to be selected as appropriate in accordance with the thickness of a silicide region to be formed. In this embodiment mode, a 10-nm-thick nickel layer is formed as the metal layer 1103. Note that, if a natural oxide film has been formed on the exposed semiconductor layer 32 when the metal layer 1103 is formed, the metal layer 1103 is formed after the natural oxide layer is removed.

Figure 9D:
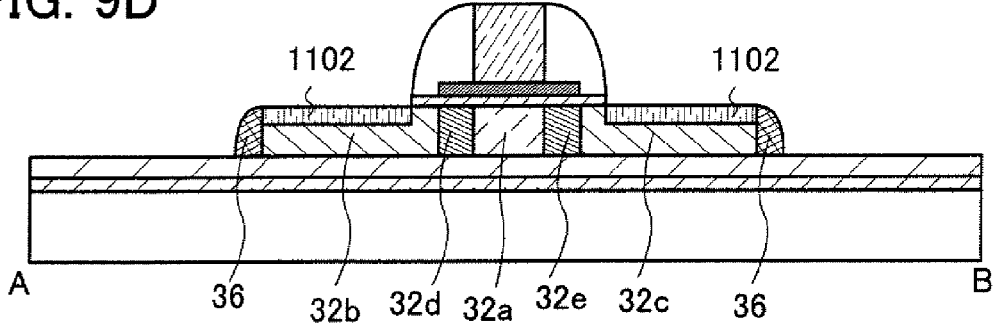

Next, the silicide regions 1102 are formed in part of the semiconductor layer 32 (FIG. 9D).

By thermal treatment, reaction occurs in the region in which the semiconductor layer 32 and the metal layer 1103 are in contact with each other, whereby the silicide regions 1102 are formed. The silicide regions 1102 are formed by making part of the semiconductor layer 32 which is in contact with the metal layer 1103 silicide. At this time, the high-concentration impurity regions 32b and 32c formed in the semiconductor layer 32 are reduced since part of the high-concentration impurity regions 32b and 32c is made silicide. In other words, the silicide regions are formed in part of the high-concentration impurity regions. For example, when a nickel film is formed as the metal layer 1103, nickel silicide is formed as the silicide regions 1102. In a similar manner, when a titanium layer, a cobalt layer, or a platinum layer is formed as the metal layer 1103, titanium silicide, cobalt silicide, or platinum silicide is formed as the silicide regions 1102.

The thermal treatment can be performed using RTA or an annealing furnace. Specifically, the thermal treatment may be performed at temperatures of 300 to 700° C., for 10 seconds to 1 hour, and preferably for 20 seconds to 30 minutes. In this embodiment mode, thermal treatment at 550° C. for 30 seconds is performed to form the silicide regions 1102 made of nickel silicide.

In FIG. 9D, the silicide regions 1102 are formed to have a thickness less than that of the region of the semiconductor layer 32 where the channel formation region 32a is formed. Specifically, in the semiconductor layer 32 in the regions which do not overlap with the sidewall insulating layers 1101, the high-concentration impurity regions 32b and 32c are formed on the side which is in contact with the insulating layer 31b and the silicide regions 1102 are formed on the high-concentration impurity regions 32b and 32c.

Note that the shape, thickness, and the like of the silicide region 1102 can be selected by controlling the thickness of the metal layer 1103 to be reacted, temperature of thermal treatment, period of time for thermal treatment, and the like as appropriate. For example, as shown in FIG. 10B in the semiconductor layer 32 in the region which does not overlap with the sidewall insulating layer 1101, either partially or entirely, the silicide region 1102 which is formed by making the semiconductor layer 32 from the top surface to the bottom surface silicide may be formed. The top surface here means the surface of the semiconductor layer 32 on the side on which a metal layer for forming silicide is formed and the bottom surface means the surface on the side which is in contact with the insulating layer 31b. Further, when the semiconductor layer 32 from the top surface to the bottom surface is entirely made silicide, the high-concentration impurity region is formed below the sidewall insulating layer 1101. Note that the present invention is not particularly limited thereto; part of the silicide region may extend to the semiconductor layer 32 in the region below the sidewall insulating layer 1101 (except the channel formation region 32a).

Further, in the case where the metal layer which has not reacted remains after the semiconductor layer 32 and the metal layer 1103 are reacted with each other, the metal layer which has not reacted is removed. Although not shown in the drawing, the metal layer 1103 formed over the insulating layer 36, the sidewall insulating layer 1101, the conductive layer 34b, and the insulating layer 31b is removed. Further, in the case where the metal layer which has not reacted remains over the silicide regions 1102, the remaining metal layer is also removed. For removal of the metal layer which has not reacted, wet etching or dry etching can be used. At this time, an etching gas or an etchant which provides high etching selectivity of the metal layer which has not reacted with respect to other layers (e.g., the insulating layer 36, the sidewall insulating layer 1101, the conductive layer 34b, the insulating layer 31b, and the silicide regions 1102) may be used; that is, the etching rate with respect to the metal layer may be high and the etching rate with respect to other layers may be low. For example, in the case where the metal layer 1103 is formed of nickel, the metal layer which has not reacted can be removed by wet etching using a solution in which hydrochloric acid (HCl), nitric acid ($HNO_3$), and pure water ($H_2O$) are mixed; for example, the mixture ratio of the solution can be set to $HCl:HNO_3:H_2O=3:2:1$.

In this embodiment mode, since the insulating layer 36 is formed so as to be in contact with the side surface of the end portion of the semiconductor layer 32, the side surface of the semiconductor layer 32 can be prevented from being etched upon removing the metal layer which has not reacted by etching.

In the case where the silicide region is formed, it is necessary that the silicide region and the conductive layer forming the gate electrode are not in contact with each other. This is because, if the silicide region and the gate electrode are in contact with each other, the gate electrode and the source or drain region are shorted and switching characteristics (an on/off ratio) cannot be obtained, so that operation as a semiconductor device cannot be provided. Therefore, in this embodiment mode, the width of the conductive layers 34a and 34b forming the gate electrode 34 is made smaller than that of the insulating layer 33 which serves as a gate insulating layer, so that the edge of the sidewall insulating layer 1101 and the edge of the insulating layer 33 are almost in alignment.

Figure 10A:
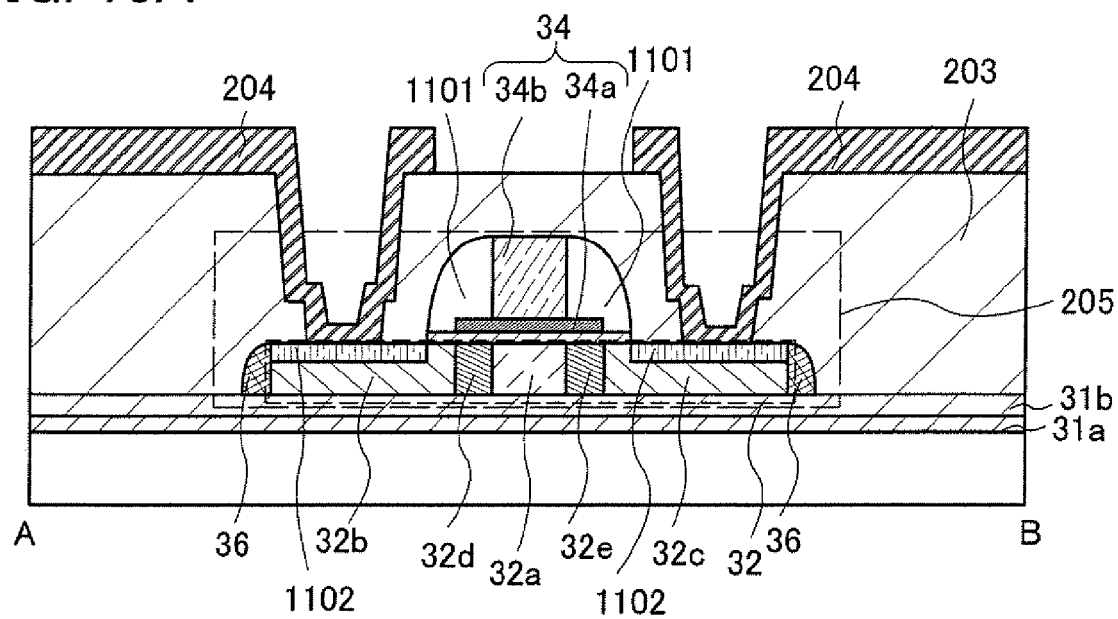
FIGS. 10A and 10B are cross-sectional views for explaining a structure of a semiconductor device of the present invention.
Figure 10B:
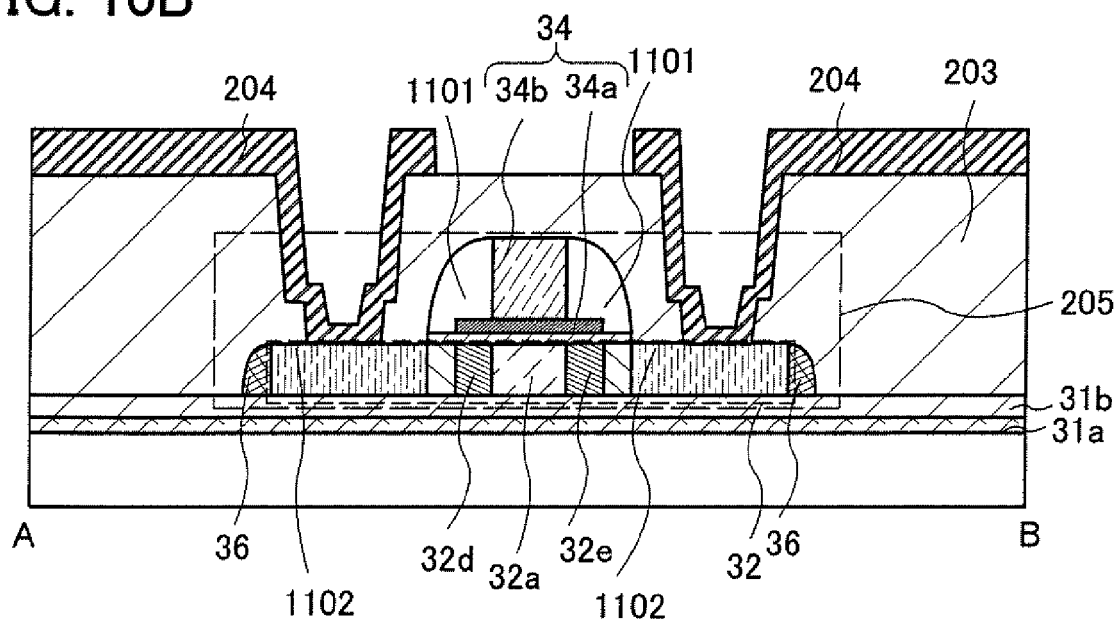

Next, the insulating layer 203 is formed so as to cover the insulating layers, the conductive layers, and the like provided over the substrate 30 (FIG. 10A).

The subsequent manufacturing steps are similar to those in Embodiment Mode 1, and by forming the contact holes which reach the semiconductor layer 32 in the insulating layer 203 and forming the conductive layers 204 over the insulating layer 203 and in the contact holes, the semiconductor device shown in FIGS. 8A to 8C or 10A and 10B can be manufactured.

Figure 11A:
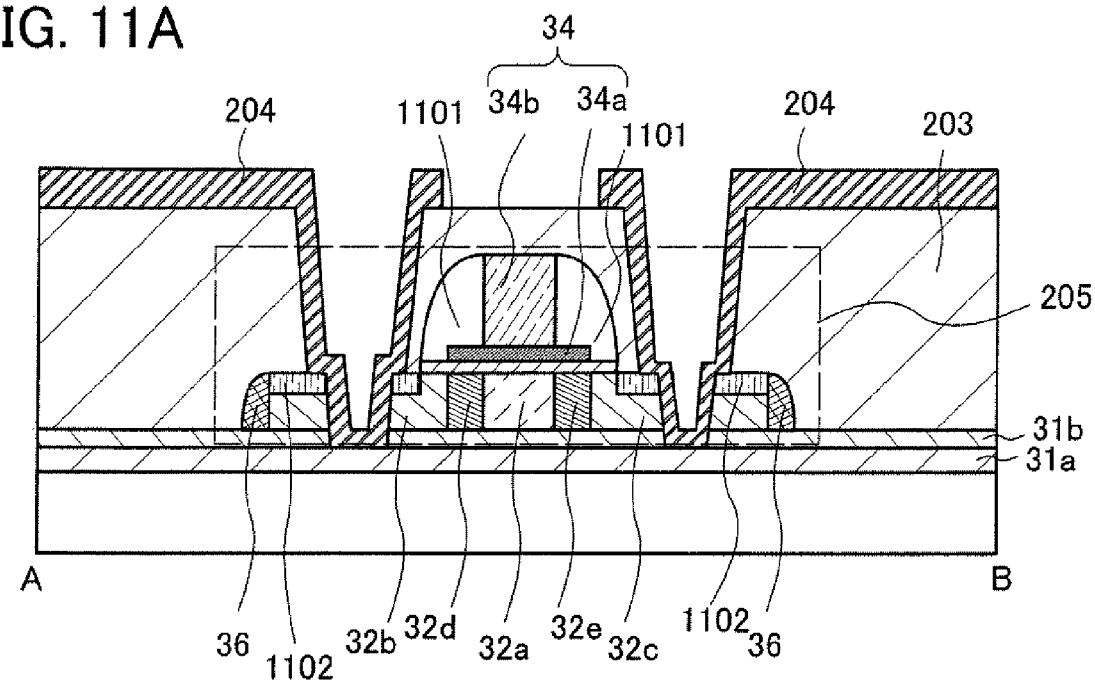
FIGS. 11A and 11B are cross-sectional views for explaining a structure of a semiconductor device of the present invention.
Figure 11B:
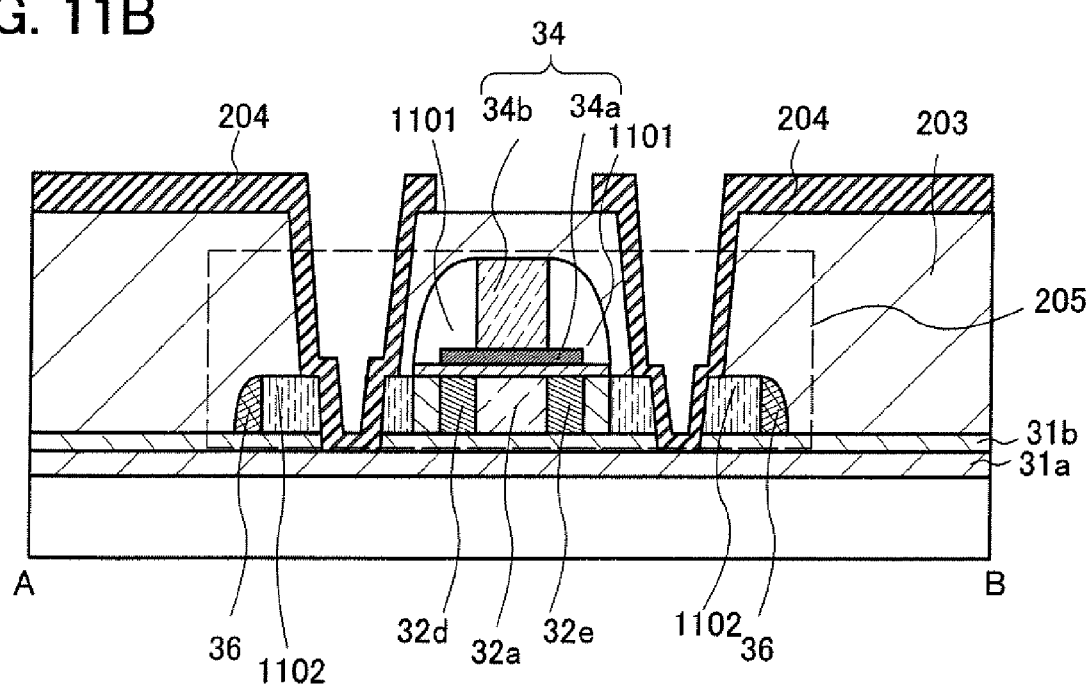

The semiconductor device of this embodiment mode is not limited to the one shown in FIGS. 8A to 10B and may have shapes shown in FIGS. 11A and 11B.

In the semiconductor device shown in FIG. 11A, the shape of a contact hole in which a conductive layer 204 is formed is different from that in the structure shown in FIG. 10A. That is, in the semiconductor device shown in FIG. 11A, the contact holes in which the conductive layers 204 are formed are formed so as to reach an insulating layer 31a by etching an insulating layer 203, impurity regions 32b and 32c of a semiconductor layer 32, and an insulating layer 31b. The opening formed in the semiconductor layer 32 is smaller than that formed in the insulating layer 203. That is, in FIG. 11A, the conductive layers 204 and the impurity regions 32b and 32c are electrically connected to each other at part of the surfaces of the impurity regions 32b and 32c and at the side surfaces of the contact holes which are formed in the impurity regions 32b and 32c. The contact hole shown in FIG. 11A can be formed similarly to those shown in FIGS. 4A, 4B, and 5. Without limitation to the one shown in FIG. 11A, either partially or entirely, the semiconductor layer 32 may be made silicide from the top surface to the bottom surface to form the silicide region 1102 as shown in FIG. 11B.

In this embodiment mode, since the contact hole having the step portion at the side surface can be formed by one etching process, the number of masks and manufacturing steps can be reduced. Therefore, a semiconductor device with favorable characteristics in which variation in thickness or disconnection of the source electrode or the drain electrode formed in the contact hole is prevented can be easily manufactured.

Further, in this embodiment mode, when the source electrode or the drain electrode is made in contact with the source region or the drain region at the side surface of the contact hole which is formed in the source region or the drain region, since it is not necessary to stop the etching at the surface of the semiconductor layer, the etching in formation of the contact hole can be easily controlled. Thus, a semiconductor device in which deterioration of characteristics is suppressed can be easily manufactured.

Embodiment Mode 4

As for the semiconductor devices described in Embodiment Modes 1 to 3, an oxide film formed of silicon oxide is formed in a single crystal silicon substrate, and a single crystal semiconductor thin film over the oxide film can be used as an active layer. In this embodiment mode, a semiconductor device which employs an SOI technology referred to as SIMOX will be described.

Figure 12A:
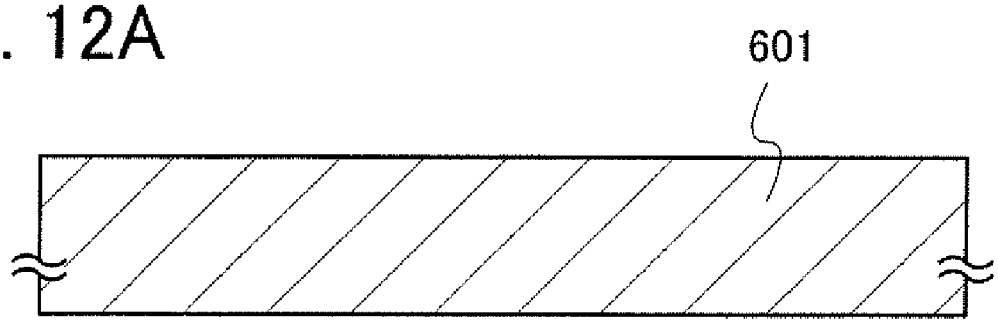
FIGS. 12A to 12D are cross-sectional views for explaining manufacturing steps of a semiconductor device of the present invention.

First, a single crystal silicon substrate 601 which serves as a material for forming a single crystal silicon layer is prepared (FIG. 12A). In this embodiment mode, the case where a p-type single crystal silicon substrate is used is described; however, an n-type single crystal silicon substrate may also be used. Of course, a single crystal silicon germanium substrate can also be used.

Figure 12B:
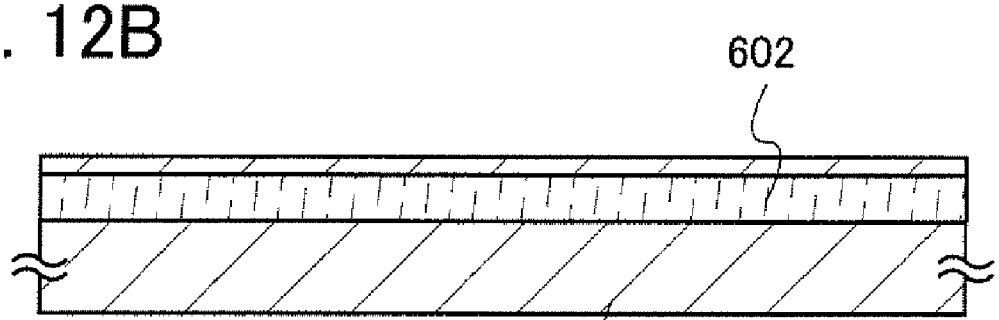

Next, oxygen ions are added to the single crystal silicon substrate 601, and an oxygen-containing layer 602 is formed at a predetermined depth (FIG. 12B). The oxygen ions may be added with a dose of, for example, approximately $1 \times 10^{18}$ atoms/cm$^2$. Note that the depth at which the oxygen-containing layer 602 is formed (the distance between a main surface of the single crystal silicon substrate 601 and the oxygen-containing layer 602) is the thickness of a single crystal silicon layer which serves as an active layer of a TFT which is formed later.

Figure 12C:
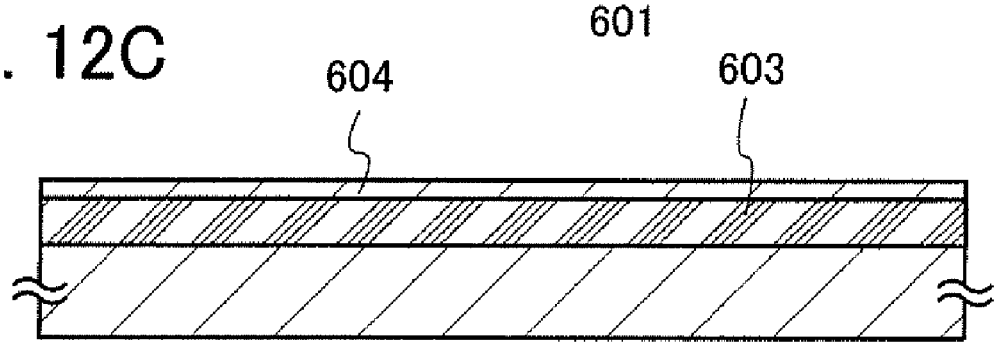

Next, thermal treatment is performed at temperatures of 800 to 1200° C. and the oxygen-containing layer 602 is changed into a buried insulating layer 603. The width of the oxygen-containing layer 602 in a depth direction is determined by the distribution of the oxygen ions when the ions are added. Because the concentration of the oxygen ions decreases in a direction from the main surface of the single crystal silicon substrate 601 to the oxygen-containing layer 602, an interface between the single crystal silicon substrate 601 and the oxygen-containing layer 602 is unclear; however, through this thermal treatment, the interface between the single crystal silicon substrate 601 and the buried insulating layer 603 becomes clear (FIGS. 12B and 12C).

The thickness of the buried insulating layer 603 is 10 to 500 nm (typically, 20 to 50 nm). In this embodiment mode, because the single crystal silicon substrate 601 and the buried insulating layer 603 bond stably at the interface, a thin buried insulating layer with a thickness of approximately 20 to 50 nm can be formed.

When the buried insulating layer 603 is formed in this manner, part of the single crystal silicon substrate is left over the buried insulating layer 603, and thus, a single crystal silicon layer 604 is formed. Note that the depth at which the oxygen-containing layer 602 is formed is adjusted so that the thickness of the single crystal silicon layer 604 is 10 to 200 nm (preferably, 10 to 50 nm, more preferably, 10 to 30 nm).

Figure 12D:
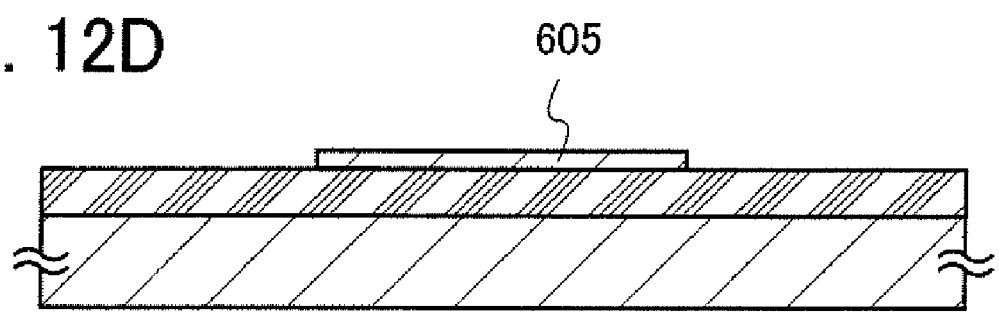

Next, a resist is formed over the single crystal silicon layer 604 as selected and the single crystal silicon layer 604 is etched as selected, to form an island-shaped single crystal silicon layer 605 which serves as an active layer of a TFT which is formed later Note that in this embodiment mode, only one island-shaped single crystal silicon layer is described; however, a plurality of island-shaped single crystal silicon layers may be formed over one substrate (FIG. 12D).

By the subsequent manufacturing steps similar to those in Embodiment Modes 1 to 3, the semiconductor device according to the present invention can be manufactured.

In this embodiment mode, since the contact hole having the step portion at the side surface can be formed by one etching process, the number of masks and manufacturing steps can be reduced. Therefore, a semiconductor device with favorable characteristics in which variation in thickness or disconnection of the source electrode or the drain electrode formed in the contact hole is prevented can be easily manufactured.

Further, in this embodiment mode, when the source electrode or the drain electrode is made in contact with the source region or the drain region at the side surface of the contact hole which is formed in the source region or the drain region, since it is not necessary to stop the etching at the surface of the semiconductor layer, the etching in formation of the contact hole can be easily controlled. Thus, a semiconductor device in which deterioration of characteristics is suppressed can be easily manufactured.

In addition, since the single crystal semiconductor layer is used as an active layer in the semiconductor device of this embodiment mode, characteristics can be further improved.

Embodiment Mode 5

In this embodiment mode, a semiconductor device will be described, in which an oxide film formed of silicon oxide is formed over a single crystal silicon substrate, and a single crystal semiconductor thin film formed over the oxide film is used as an active layer In this embodiment mode, a semiconductor device that employs an SOI substrate which is formed using a Smart-Cut method will be described.

First, a single crystal silicon substrate 801 which serves as a material for forming a single crystal silicon layer is prepared. In this embodiment mode, the case where a p-type single crystal silicon substrate is used is described; however, an n-type single crystal silicon substrate may also be used. Of course, a single crystal silicon germanium substrate can also be used.

Figure 13A:
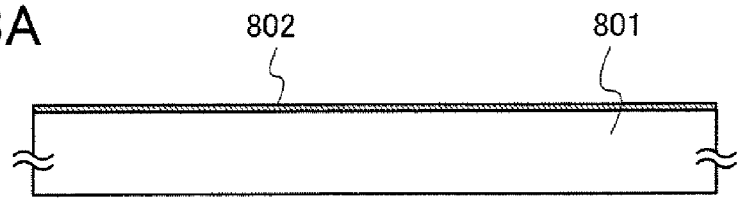
FIGS. 13A to 13F are cross-sectional views for explaining manufacturing steps of a semiconductor device of the present invention.

Next, thermal oxidation is performed to form a silicon oxide film 802 over a main surface of the substrate 801 (a surface which corresponds to an element formation surface). The film thickness may be decided as appropriate by a practitioner; however, preferably it is 10 to 500 nm (typically, 20 to 50 nm). The silicon oxide film 802 later serves as part of a buried insulating layer of an SOI substrate (FIG. 13A).

Figure 13B:
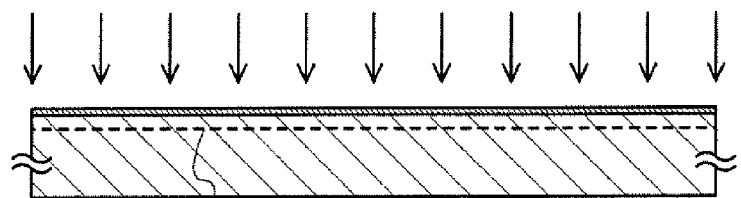

Next, hydrogen ions are added from the main surface side of the single crystal silicon substrate 801 through the silicon oxide film 802 to form a hydrogen-containing layer 803 (FIG. 13B). Note that the depth at which the hydrogen-containing layer 803 is formed (the distance between the main surface of the single crystal silicon substrate 801 and the hydrogen-containing layer 803) is the thickness of a single crystal silicon layer which serves as an active layer of a TFT later. For example, hydrogen ions can be added by an ion implantation method with a dose of $1\times10^{16}$ to $1\times10^{17}$ atoms/cm$^2$ such that a single crystal silicon layer with a thickness of 50 nm remains between the main surface of the single crystal silicon substrate 801 and the hydrogen-containing layer 803.

Figure 13C:
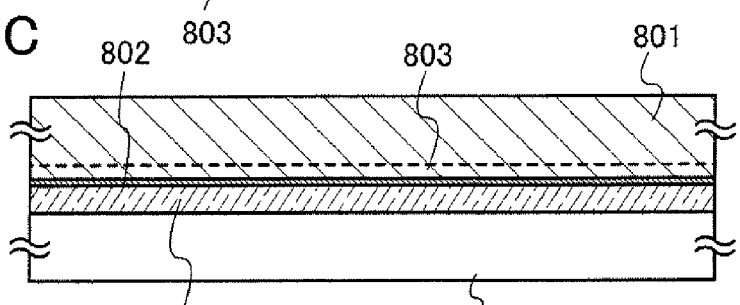

Next, the single crystal silicon substrate 801 and a supporting substrate are bonded. In this embodiment mode, a single crystal silicon substrate 804 is used as the supporting substrate, and a silicon oxide film 805 for bonding is provided over the surface of the single crystal silicon substrate 804 (FIG. 13C). Note that instead of the single crystal silicon substrate 804, a silicon substrate formed by a float zone method, a polycrystalline silicon substrate, or the like may be used. Further, a substrate with high thermostability, such as a quartz substrate, a ceramic substrate, a crystallized glass substrate, or the like may also be used.

When bonding is performed, the bonding interface is two highly hydrophilic silicon oxide films.

Figure 13D:
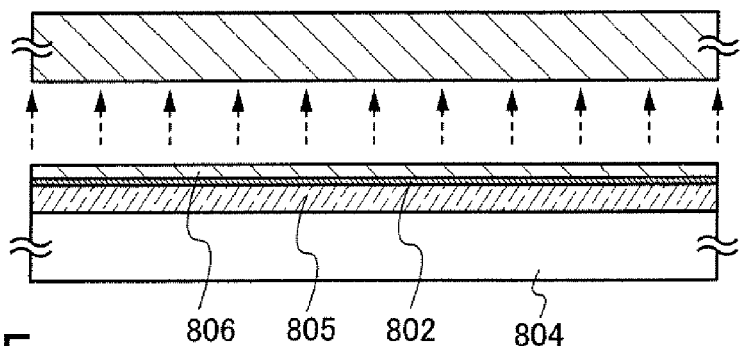

Next, thermal treatment (first thermal treatment) is performed at temperatures of 400 to 600° C. (e.g., at 500° C.). Through this thermal treatment, the volume of microvoids is changed in the hydrogen-containing layer 803, and a ruptured section is generated along the hydrogen-containing layer 803. Therefore, the single crystal silicon substrate 801 is separated, and the silicon oxide film 802 and a single crystal silicon layer 806 are left over the supporting substrate (FIG. 13D).

Figure 13E:
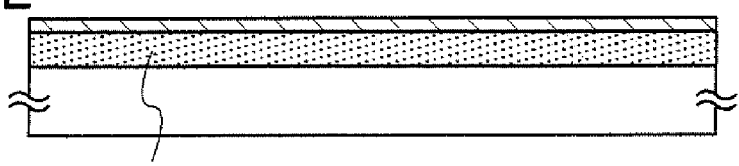

Next, as second thermal treatment, furnace annealing is performed at temperatures in the range of 1050 to 1150° C. (e.g., at 1100° C.). In this treatment, stress of Si—O—Si bonds is relieved at the bonding interface, so the bonding interface stabilizes. That is, this is treatment for completely bonding the single crystal silicon layer 806 to the supporting substrate. When the bonding interface stabilizes in this manner, a buried insulating layer 807 is formed (FIG. 13E). Note that in this embodiment mode, the hydrogen-containing layer 803 is formed and the thin single crystal silicon layer 806 is formed by generating a ruptured section along the hydrogen-containing layer 803; however, the method for forming the single crystal silicon layer 806 is not limited to thereto. The thin film single crystal silicon layer 806 may be formed by polishing the single crystal silicon substrate 801 without providing the hydrogen-containing layer 803.

Next, treatment for planarizing the surface of the single crystal silicon layer 806 may be performed. For the planarization, a polishing process referred to as chemical mechanical polishing (CMP) or furnace annealing treatment in a reducing atmosphere at high temperature (approximately 900 to 1200° C.) may be performed.

The final thickness of the single crystal silicon layer 806 is 10 to 200 nm (preferably, 10 to 50 nm, more preferably, 10 to 30 nm).

Figure 13F:
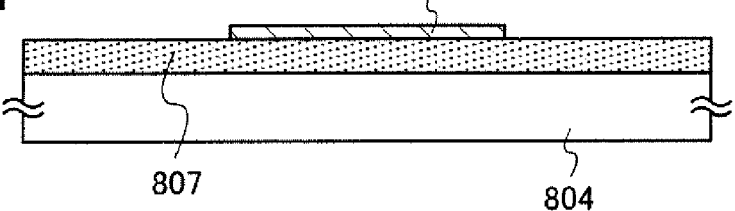

Next, a resist is formed over the single crystal silicon layer 806 as selected and the single crystal silicon layer 806 is etched as selected, to form an island-shaped single crystal silicon layer 808 which serves as an active layer of a TFT which is formed later. Note that in this embodiment mode, only one island-shaped single crystal silicon layer is described; however, a plurality of island-shaped single crystal silicon layers may be formed over one substrate (FIG. 13F).

By the subsequent manufacturing steps similar to those in Embodiment Modes 1 to 3, the semiconductor device according to the present invention can be manufactured.

In this embodiment mode, since the contact hole having the step portion at the side surface can be formed by one etching process, the number of masks and manufacturing steps can be reduced. Therefore, a semiconductor device with favorable characteristics in which variation in thickness or disconnection of the source electrode or the drain electrode formed in the contact hole is prevented can be easily manufactured.

Further, in this embodiment mode, when the source electrode or the drain electrode is made in contact with the source region or the drain region at the side surface of the contact hole which is formed in the source region or the drain region, since it is not necessary to stop the etching at the surface of the semiconductor layer, the etching in formation of the contact hole can be easily controlled. Thus, a semiconductor device in which deterioration of characteristics is suppressed can be easily manufactured.

In addition, since the single crystal semiconductor layer is used as an active layer in the semiconductor device of this embodiment mode, characteristics can be further improved.

Embodiment Mode 6

In this embodiment mode, a method for manufacturing a display device (an EL display device) using the semiconductor device described in Embodiment Mode 1 and including an electroluminescence element (hereinafter also referred to as an EL element) will be described. Note that the semiconductor device that can be used in this embodiment mode is not limited to the one described in Embodiment Mode 1, and the semiconductor devices described in Embodiment Modes 2 to 5 may also be used.

In this embodiment mode, a first electrode 110 is formed by using a light-transmitting film so that light from an electroluminescence element is extracted from the first electrode 110 side. In this embodiment mode, indium tin oxide containing silicon oxide (ITSO) is used as the first electrode 110.

Figure 14:
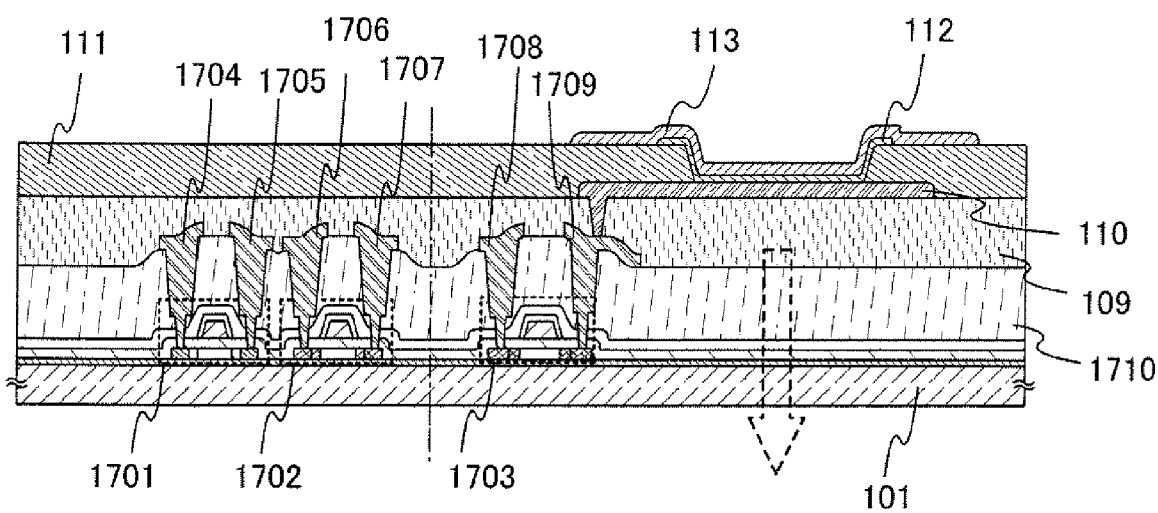
FIG. 14 is a cross-sectional view for explaining a structure of a semiconductor device of the present invention.

First, as shown in FIG. 14, TFTs 1701 to 1703, an insulating layer 1710 which covers the TFTs 1701 to 1703, and wirings 1704 to 1709 which electrically connect source regions and drain regions of the TFTs 1701 to 1703 are formed as in Embodiment Mode 1. Then, an insulating layer 109 is formed so as to cover the wirings 1704 to 1709, and the first electrode 110 which is electrically connected to the wiring 1709 is formed over the insulating layer 109. Next, an insulating film 111 (also referred to as a bank, a partition wall, a barrier, an embankment, or the like) is formed to cover an end portion of the first electrode 110 and the insulating layer 109.

The insulating film 111 can be formed of silicon oxide, silicon nitride, silicon oxynitride, aluminum oxide, aluminum nitride, aluminum oxynitride, or other inorganic insulating materials; acrylic acid, methacrylic acid, or a derivative thereof; a heat resistant high molecular material such as polyimide, aromatic polyamide, or polybenzimidazole; inorganic siloxane containing a Si—O—Si bond among compounds composed of silicon, oxygen, and hydrogen; or an organic siloxane based insulating material in which hydrogen bonded to silicon is substituted by an organic group such as methyl or phenyl. A photosensitive or non-photosensitive material such as acrylic or polyimide may also be used. In this embodiment mode, the insulating film 111 is formed using photosensitive polyimide so as to have a thickness of 1.5 μm in a flat region.

In addition, the insulating film 111 preferably has a shape of which radius of curvature changes continuously, so that coverage by an electroluminescent layer 112 (a layer containing an organic compound) and a second electrode 113 formed over the insulating film 111 can be improved.

In order to further improve reliability, nitridation treatment or oxidation treatment may be performed to the first electrode 110 and the insulating film 111 by using a high-density plasma apparatus before the electroluminescent layer 112 is formed. By nitriding or oxidizing the first electrode 110 by using the high-density plasma apparatus, plasma damage in reforming the surface of the electrode can be reduced, and a surface with fewer defects can be obtained. Thus, a light-emitting element in this embodiment mode can provide display with high definition and less unevenness. Further, when the insulating film 111 is nitrided, the surface of the insulating film 111 is reformed, and moisture can be prevented from being absorbed into the insulating film. When the insulating film 111 is oxidized, the film becomes stronger, and release of an organic gas can be suppressed. In this embodiment mode, treatment with less plasma damage can be performed by using a high-density plasma apparatus. It is determined which of oxidization treatment and nitridation treatment is performed to the surface of the insulating film 111 by considering a material of the insulating film and effect as appropriate.

The electroluminescent layer 112 is formed over the first electrode 110. Although only one pixel is shown in FIG. 14, electroluminescent layers for R (red), G (green), and B (blue) are formed in this embodiment mode. In this embodiment mode, as the electroluminescent layer 112, materials exhibiting light emission of red (R), green (G), and blue (B) are each formed as selected by an evaporation method using an evaporation mask. The materials exhibiting light emission of red (R), green (G), and blue (B) can be formed by a method of forming as selected with an evaporation method using an evaporation mask, or a droplet discharging method. In the case of a droplet discharging method, there is an advantage that materials of R, Q and B can be individually formed without using a mask. In this embodiment mode, materials exhibiting light emission of R (red), G (green), and B (blue) are each formed by an evaporation method.

Before evaporation of the electroluminescent layer, it is preferable to remove moisture and the like by thermal treatment in an atmosphere in which an inert gas is a main component, an oxygen concentration is 5% or less, and a water concentration is 1% or less. In this embodiment mode, thermal treatment is performed at 300° C. for one hour.

Next, a second electrode 113 is formed using a conductive film over the electroluminescent layer 112. The second electrode 113 may be formed using a material having a low work function (Al, Ag, Li, Ca, or alloy thereof such as MgAg, MgIn, AlLi, CaF$_2$, or CaN). Accordingly, a light-emitting element including the first electrode 110, the electroluminescent layer 112, and the second electrode 113 is formed.

In the display device shown in FIG. 14, light from the light-emitting element is transmitted through the films that are formed between the substrate 101 and the first electrode 110 and is emitted from the first electrode 110 side in a direction indicated by an arrow.

It is effective to form a passivation film so as to cover the second electrode 113. The passivation film can be formed using an insulating film including silicon nitride, silicon oxide, silicon oxynitride (SiON), silicon nitride oxide (SiNO), aluminum nitride (AlN), aluminum oxynitride (AlON), aluminum nitride oxide (AlNO) containing more nitrogen than oxygen, aluminum oxide, diamond-like carbon (DLC), or nitrogen-containing carbon (CN). The passivation film can have a single layer structure of the insulating film or a stacked-layer structure combining the insulating films. Further, siloxane in which a skeleton structure is formed of bonds of silicon (S) and oxygen (O) may also be used. In siloxane, an organic group containing at least hydrogen (for example, an alkyl group or aromatic hydrocarbon) is used as a substituent. In addition, as a substituent, a fluoro group, or an organic group containing at least hydrogen and a fluoro group may also be used.

In this case, a film with favorable coverage is preferably used as the passivation film. A carbon film, in particular, a DLC film is effectively used. Since the DLC film can also be formed within a temperature range of room temperature to 100° C., the DLC film can be easily formed over the electroluminescent layer 112 having low heat resistance. The DLC film has a high blocking property with respect to oxygen, and thus, the electroluminescent layer 112 can be prevented from being oxidized. Accordingly, a problem that the electroluminescent layer 112 is oxidized during a subsequent sealing process can be prevented.

Next, the substrate 101 including the light-emitting element and a sealing substrate are bonded to each other by a sealing material, and the light-emitting element is sealed. Since moisture is prevented from entering from a side-direction by the sealing material, degradation of the light-emitting element can be prevented and reliability of the display device can be improved. A region surrounded by the sealing material may be filled with a filler and may be filled with nitrogen or the like by sealing in a nitrogen atmosphere. Further, the filler can be dripped in a liquid state so as to fill the display device. This embodiment mode employs a bottom emission type, and it is not necessary to use a filler having a light-transmitting property. However, in the case of a structure in which light is extracted through the filler, the filler is needed to be formed by using a material having a light-transmitting property. As an example of the filler, a visible light curable, ultraviolet ray curable, or thermal curable epoxy resin can be given. The display device including the light-emitting element can be completed though the above manufacturing steps.

A drying agent is preferably provided in the EL display panel to prevent degradation of the element due to moisture. In this embodiment mode, the drying agent is provided in a concave portion that is formed on the sealing substrate to surround a pixel region, so that a thin shape is achieved. Further, by providing the drying agent also in a region corresponding to a gate wiring layer, a moisture absorbing area can be larger and moisture absorbing effect is enhanced. In addition, since the drying agent is formed over the gate wiring layer which does not emit light itself, light extraction efficiency is not lowered.

The treatment of sealing the light-emitting element is treatment for protecting the light-emitting element from moisture, and any of a method for mechanically sealing the light-emitting element by a cover material, a method for sealing the light-emitting element by a thermal curable resin or an ultraviolet ray curable resin, and a method for sealing the light-emitting element by a thin film having a high barrier property such as metal oxide or metal nitride is used. As the sealing substrate or the cover material, glass, ceramics, plastic, or metal can be used, and a material which transmits light is needed to be used in the case where light is emitted to a cover material side. The cover material and the substrate including the light-emitting element are attached to each other using a sealing material such as a thermal curable resin or an ultraviolet ray curable resin, and a sealed space is formed by curing the resin using thermal treatment or ultraviolet ray irradiation treatment. It is also effective to provide a moisture absorbing material typified by barium oxide in this sealed space. This moisture absorbing material may be provided on the sealing material, or over the partition wall or in the periphery of the light-emitting element so as not to block light from the light-emitting element. Further, the space between the cover material and the substrate including the light-emitting element can also be filled with a thermal curable resin or an ultraviolet ray curable resin. In this case, it is effective to add a moisture absorbing material typified by barium oxide in the thermal curable resin or the ultraviolet ray curable resin.

The TFTs 1701 to 1703 shown in this embodiment mode are manufactured by any of the methods described in Embodiment Modes 1 to 5, and a semiconductor device with favorable characteristics in which variation in thickness or disconnection of the source electrode or the drain electrode is prevented can be easily manufactured. Further, when the source electrode or the drain electrode is made in contact with the source region or the drain region at the side surface of the contact hole which is formed in the source region or the drain region, since it is not necessary to stop the etching at the surface of the semiconductor layer, the etching in formation of the contact hole can be easily controlled. Thus, a semiconductor device in which deterioration of characteristics is suppressed can be easily manufactured. Consequently, an EL display device with favorable characteristics can be easily manufactured.

Embodiment Mode 7

In this embodiment mode, a method for manufacturing a tansmissive liquid crystal display device using the semiconductor device which is manufactured in Embodiment Mode 1 will be described. Of course, the semiconductor devices manufactured in Embodiment Modes 2 to 5 can also be used.

Figure 15:
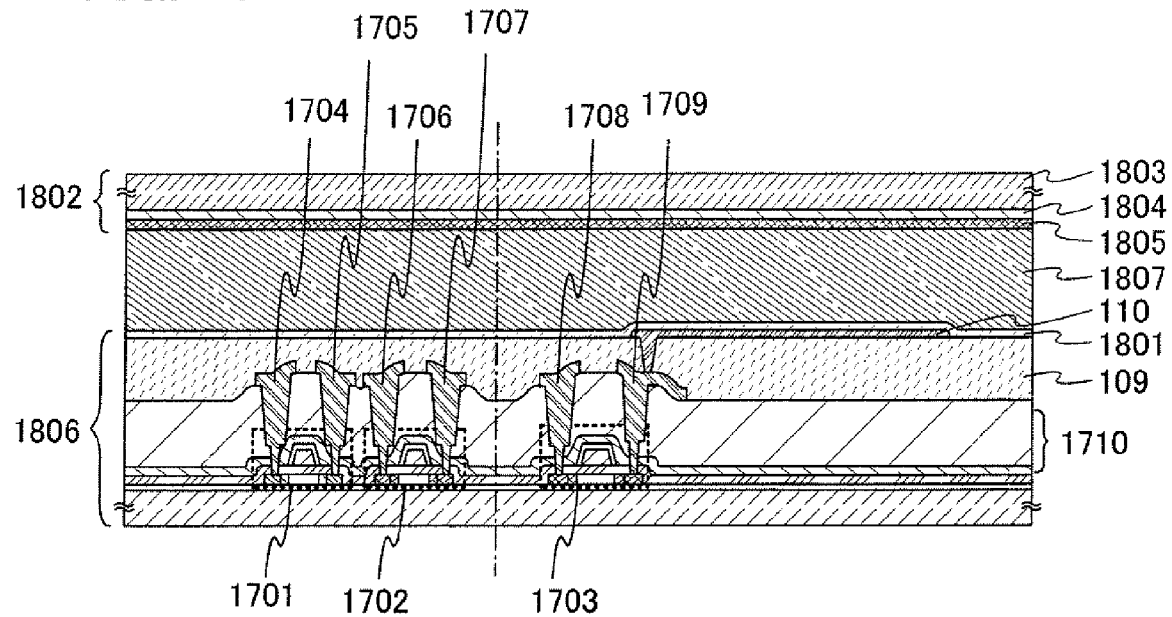
FIG. 15 is a cross-sectional view for explaining a structure of a semiconductor device of the present invention.

First, TFTs 1701 to 1703, an insulating layer 1710 which covers the TFTs 1701 to 1703, and wirings 1704 to 1709 which electrically connect source regions and drain regions of the TFTs 1701 to 1703 are formed similarly to those in Embodiment Mode 1 (FIG. 15). Then, an insulating layer 109 is formed so as to cover the wirings 1704 to 1709, and a first electrode 110 which is electrically connected to the wiring 1709 is formed over the insulating layer 109. In this embodiment mode, indium tin oxide containing silicon oxide (ITSO) is used as a material for the first electrode 110. Then, as shown in FIG. 15, an alignment film 1801 is formed over the insulating layer 109 and the first electrode 110. In this embodiment mode, polyimide is used as the alignment film 1801. Next, a counter substrate 1802 is prepared. The counter substrate 1802 includes a glass substrate 1803, a counter electrode 1804 formed of a transparent conductive film, and an alignment film 1805.

Then, a TFT substrate 1806 obtained through the manufacturing steps as described above and the counter substrate 1802 are attached to each other by a sealing material. Here, a spacer may be provided between the alignment film 1801 and the alignment film 1805 to keep a constant gap between the both substrates. After that, a liquid crystal 1807 is injected between the both substrates, and a transmissive liquid crystal display device as shown in FIG. 15 is completed by sealing with the sealing material.

A transmissive liquid crystal display device is described in this embodiment mode, but a liquid crystal display device of the present invention is not limited to this type. The present invention can also be applied to a reflective liquid crystal display device by using an electrode having reflectivity as the first electrode 110, or by providing a reflective film for an upper surface or a bottom surface of the first electrode 110. In addition, the present invention may be applied to a semi-transmissive liquid crystal display device.

The TFTs 1701 to 1703 shown in this embodiment mode are formed by any of the methods described in Embodiment Modes 1 to 5, and a semiconductor device with favorable characteristics in which variation in thickness or disconnection of the source electrode or the drain electrode is prevented can be easily manufactured. Further, when the source electrode or the drain electrode is made in contact with the source region or the drain region at the side surface of the contact hole which is formed in the source region or the drain region, since it is not necessary to stop the etching at the surface of the semiconductor layer, the etching in formation of the contact hole can be easily controlled. Thus, a semiconductor device in which deterioration of characteristics is suppressed can be easily manufactured. Consequently, a liquid crystal display device with favorable characteristics can be easily manufactured.

Embodiment Mode 8

In this embodiment mode, a method for manufacturing a semiconductor device capable of wireless communication and including the thin film transistor described in any of Embodiment Modes 1 to 5, a memory element, and an antenna will be described with reference to the drawings.

Figure 16A:
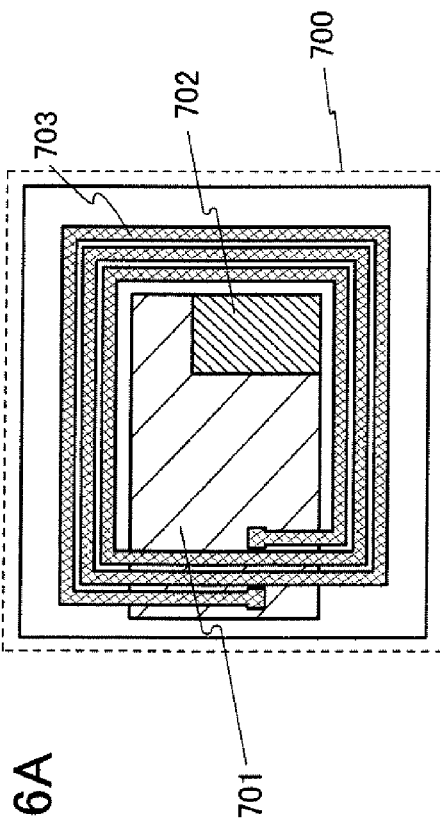
FIG. 16A is a top view and FIG. 16B is a cross-sectional view for explaining a structure of a semiconductor device of the present invention.
Figure 16B:
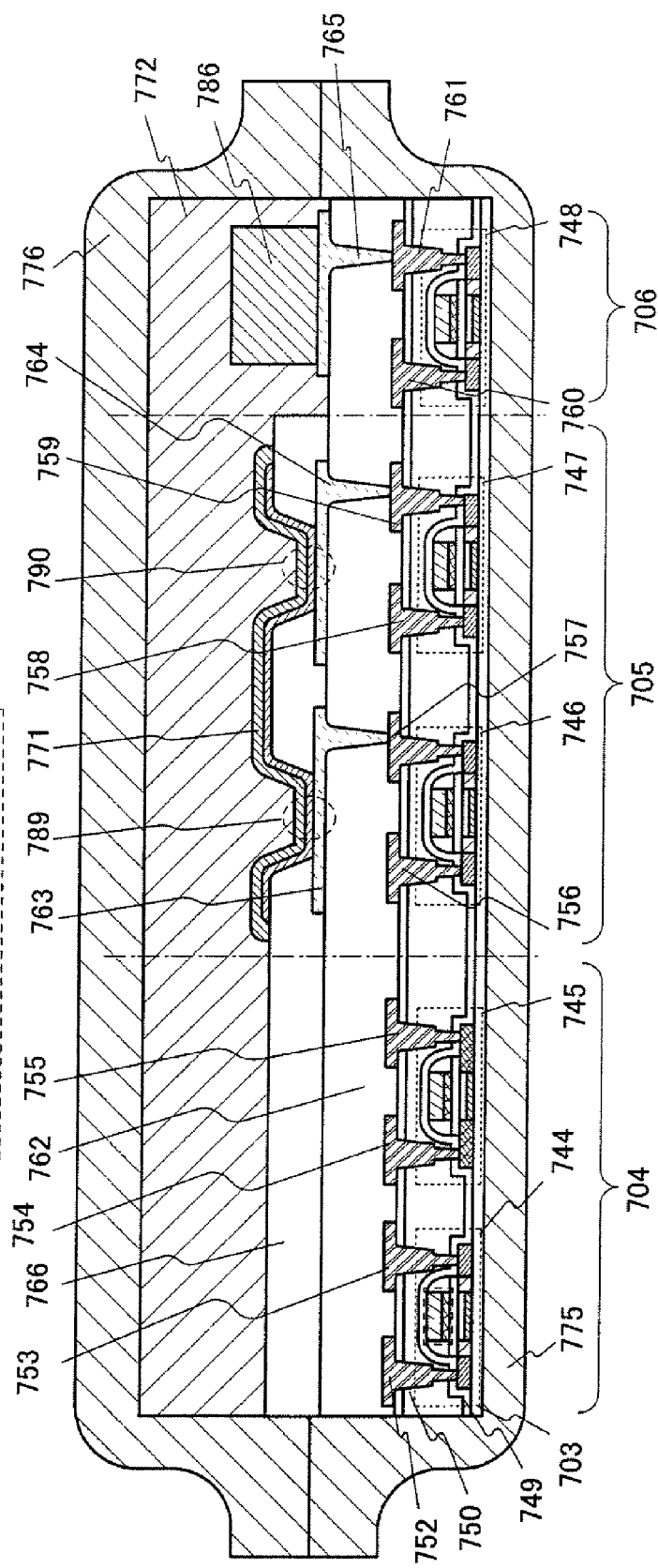
Figure 17:
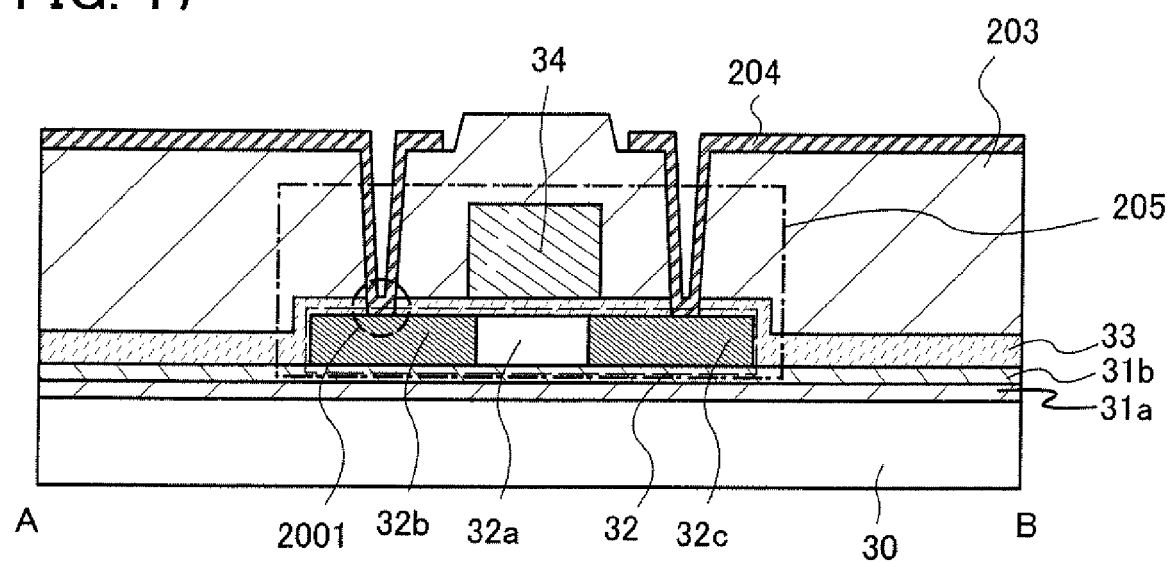
FIG. 17 is a cross-sectional view for explaining a structure of a conventional semiconductor device.

FIGS. 16A and 16B show a semiconductor device of this embodiment mode. Note that FIG. 16A illustrates an example of a top face structure of the semiconductor device of this embodiment mode, and FIG. 16B illustrates part of a cross-sectional structure of FIG. 16A.

In this embodiment mode, a semiconductor device 700 includes an integrated circuit portion 701, a memory section 702, and an antenna 703 (FIG. 16A). In FIG. 16B, a region 704 corresponds to part of the cross-sectional structure of the integrated circuit portion 701 of FIG. 16A, a region 705 corresponds to part of the cross-sectional structure of the memory section 702 of FIG. 16A, and a region 706 corresponds to part of the cross-sectional structure of the antenna 703 of FIG. 16A.

The semiconductor device of this embodiment mode includes thin film transistors (TFTs) 744 to 748 which are formed over a first substrate 775 with an insulating layer 703 interposed therebetween, an insulating layer 750 formed over the thin film transistors 744 to 748, and conductive layers 752 to 761 each of which serves as a source electrode or a drain electrode and is provided over the insulating layer 750 as shown in FIG. 16B. In addition, the semiconductor device includes an insulating layer 762 provided over the insulating layer 750 and the conductive layers 752 to 761, conductive layers 763 to 765 provided over the insulating layer 762, an insulating layer 766 provided to cover the insulating layer 762 and part of the conductive layers 763 and 764, memory elements 789 and 790 provided over the insulating layer 762, a conductive layer 786 which serves as an antenna and is provided over the conductive layer 765, an insulating layer 772 provided to cover the insulating layer 766, a conductive film 771, and the conductive layer 786 which serves as an antenna, and a second substrate 776 provided over the insulating layer 772. By the first substrate 775 and the second substrate 776, the integrated circuit portion 701, the memory section 702, and the antenna 703 of the semiconductor device are sealed.

The TFTs 744 to 748 shown in this embodiment mode are formed by any of the methods described in Embodiment Modes 1 to 5, and a semiconductor device with favorable characteristics in which variation in thickness or disconnection of the source electrode or the drain electrode is prevented can be easily manufactured. Further, when the source electrode or the drain electrode is made in contact with the source region or the drain region at the side surface of the contact hole which is formed in the source region or the drain region, since it is not necessary to stop the etching at the surface of the semiconductor layer, the etching in formation of the contact hole can be easily controlled. Thus, a semiconductor device in which deterioration of characteristics is suppressed can be easily manufactured. Consequently, a semiconductor device capable of wireless communication with favorable characteristics can be easily manufactured.

This application is based on Japanese Patent Application Serial No. 2007-079609 filed with Japan Patent Office on Mar. 26, 2007, the entire contents of which are hereby incorporated by reference.

What is claimed is:

1. A method for manufacturing a semiconductor device, comprising the steps of:
    forming a semiconductor layer over a substrate;
    forming a first insulating layer over the semiconductor layer;
    forming a gate electrode over the first insulating layer;
    forming a second insulating layer over the gate electrode;
    forming a resist having a step portion at a side surface over the second insulating layer;
    forming an opening which reaches the semiconductor layer at least in the second insulating layer so as to have a step portion at a side surface of the second insulating layer by etching using the resist as a mask; and
    forming a conductive layer at a side surface of the opening and over a top surface of the second insulating layer so as to be in contact with the semiconductor layer.

2. A method for manufacturing a semiconductor device, comprising the steps of:
    forming a first insulating layer over a substrate;
    forming a second insulating layer over the first insulating layer;
    forming a semiconductor layer over the second insulating layer;
    forming a third insulating layer over the semiconductor layer;
    forming a gate electrode over the third insulating layer;
    forming a fourth insulating layer over the gate electrode;
    forming a resist having a step portion at a side surface over the fourth insulating layer;
    forming an opening which reaches the first insulating layer at least in the second insulating layer, the semiconductor layer, and the fourth insulating layer by etching using the resist as a mask such that the opening formed in the semiconductor layer is smaller than that formed in the fourth insulating layer; and
    forming a conductive layer to be in contact with the first insulating layer at a side surface of the opening and over the fourth insulating layer.

3. The method for manufacturing a semiconductor device according to claim 1, wherein the opening is formed by dry etching.

4. The method for manufacturing a semiconductor device according to claim 1, wherein an insulating sidewall is formed at a side surface of the semiconductor layer.

5. The method for manufacturing a semiconductor device according to claim 2, wherein the opening is formed by dry etching.

6. The method for manufacturing a semiconductor device according to claim 2, wherein an insulating sidewall is formed at a side surface of the semiconductor layer.

* * * * *

UNITED STATES PATENT AND TRADEMARK OFFICE
CERTIFICATE OF CORRECTION

PATENT NO. : 7,709,368 B2
APPLICATION NO. : 12/046881
DATED : May 4, 2010
INVENTOR(S) : Shinya Sasagawa It is certified that error appears in the above-identified patent and that said Letters Patent is hereby corrected as shown below:

column 3, line 15, "he" should read "be"

column 3, line 35, "semiconductor layer" should read "semiconductor layer."

column 12, line 64, "$1 \times 10^{11}$ cm$^{-3}$ and $1 \times 10^{13}$ cm$^{/-3}$ or less" should read "$1 \times 10^{11}$ cm$^{-3}$ and $1 \times 10^{13}$ cm$^{-3}$ or less"

column 15, line 49, "FIGS. 5A to 5C" should read "FIGS. 8A to 8C"

column 15, line 51, "FIG. 5A" should read "FIG. 8A"

column 23, line 25, "insulating film 11I" should read "insulating film 111"

column 23, line 55, "R, Q and B" should read "R, G and B"

Signed and Sealed this

Twenty-first Day of September, 2010

David J. Kappos
*Director of the United States Patent and Trademark Office*